(12) United States Patent
Eden et al.

(10) Patent No.: US 8,000,767 B2
(45) Date of Patent: Aug. 16, 2011

(54) MAGNETO-OPTICAL APPARATUS AND METHOD FOR THE SPATIALLY-RESOLVED DETECTION OF WEAK MAGNETIC FIELDS

(75) Inventors: J. Gary Eden, Mahomet, IL (US); Ju Gao, Champaign, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 2226 days.

(21) Appl. No.: 10/762,223

(22) Filed: Jan. 20, 2004

(65) Prior Publication Data

US 2005/0171421 A1 Aug. 4, 2005

(51) Int. Cl.
*A61B 5/05* (2006.01)
(52) U.S. Cl. ......... 600/409; 600/322; 359/280; 250/225
(58) Field of Classification Search .................. 359/280; 250/225; 600/409, 322
See application file for complete search history.

(56) References Cited

U.S. PATENT DOCUMENTS

| | | | |
|---|---|---|---|
| 4,591,787 A | 5/1986 | Hoenig | |
| 4,613,817 A | 9/1986 | Heonig | |
| 4,693,000 A | 9/1987 | Hoenig | |
| 4,700,135 A | 10/1987 | Hoenig | |
| 4,733,180 A | 3/1988 | Hoenig et al. | |
| 4,749,946 A | 6/1988 | Hoenig | |
| 4,761,611 A | 8/1988 | Hoenig | |
| 4,771,239 A | 9/1988 | Hoenig | |
| 4,937,525 A | 6/1990 | Daalmans | |
| 4,982,157 A | 1/1991 | Seifert | |
| 4,996,479 A | 2/1991 | Hoenig | |
| 5,012,190 A | 4/1991 | Dössel | |
| 5,095,270 A | 3/1992 | Ludeke | |
| 5,193,348 A | 3/1993 | Schnapper | |
| 5,282,474 A | 2/1994 | Valdes Sosa et al. | |
| 5,283,523 A | 2/1994 | Uhl et al. | |
| 5,476,438 A | 12/1995 | Edrich et al. | |
| 5,515,301 A | 5/1996 | Corby, Jr. et al. | |
| 5,519,645 A | 5/1996 | Bohley | |
| 5,560,367 A | 10/1996 | Haardt et al. | |
| 5,579,241 A | 11/1996 | Corby, Jr. et al. | |
| 5,603,321 A | 2/1997 | Kynor et al. | |

(Continued)

OTHER PUBLICATIONS

R. Bison et al, A Laser-Pumped Magnetometer for the Mapping of Human Cardiomagnetic Fields, pp. 325-328, Applied Physics, Feb. 2003.

(Continued)

*Primary Examiner* — Brian Casler
*Assistant Examiner* — Nasir Shahrestani
(74) *Attorney, Agent, or Firm* — Brinks Hofer Gilson & Lione

(57) ABSTRACT

A detector uses the magneto-optical Kerr effect and exploits the transition region between two magnetization states of a magneto-optical film to detect magnetic fields of less than 100 pT. The magnetic field of a subject is determined by examining the polarization of light reflected from the magneto-optical film. A several μm thick, bismuth doped, YIG film is used for detection as the transition regions are steep, providing large changes in the polarization rotation angle for small variations in the applied magnetic field. The apparatus may be used in the functional imaging of various organs and systems in humans and animals or for the spatial and temporal tracking of nano or micro magnetic particles intentionally introduced into the circulatory or intestinal systems for diagnostic or research purposes.

50 Claims, 13 Drawing Sheets

Magneto-optical hysteresis curve measured for YIG film at 10 Hz

U.S. PATENT DOCUMENTS

| | | | |
|---|---|---|---|
| 5,634,496 | A | 6/1997 | Grabner, Jr. |
| 5,655,534 | A | 8/1997 | Ilmoniemi |
| 5,817,021 | A | 10/1998 | Reichenberger |
| 6,023,161 | A | 2/2000 | Dantsker et al. |
| 6,066,084 | A | 5/2000 | Edrich et al. |
| 6,216,027 | B1 | 4/2001 | Willis et al. |
| 6,871,084 | B1* | 3/2005 | Kingsley et al. ............ 600/372 |
| 7,075,055 | B2* | 7/2006 | Nagai ............................ 250/225 |
| 2002/0149832 | A1* | 10/2002 | Matsushita et al. ........... 359/280 |
| 2002/0173714 | A1* | 11/2002 | Tsukada et al. ............... 600/409 |
| 2004/0027928 | A1* | 2/2004 | Awano et al. ............ 369/13.08 |
| 2005/0020893 | A1* | 1/2005 | Diab ............................ 600/322 |

OTHER PUBLICATIONS

Dyitry Budker, "A New Spin on Magnetometry," pp. 574-575, Nature, vol. 422, Apr. 2003.

I.K. Kominis et al., A Subfemtotesla Multichannel Atomic Magnetometer, pp. 596-599, Nature, vol. 422, Apr. 2003.

D. Budker et al., Sensitive Magnetometry Based on Nonlinear Magneto-Optical Rotation, pp. 043403-1 to 043403-7, Physics Review, vol. 62, The American Physical Society 2002.

J. Seipel et al., The Magnetic Field Accompanying Neuronal Activity A New Method for the Study of the Nervous System, pp. 1-4, Journal of the Washington Academy of Sciences.

G. Baule et al., "Detection of the Magnetic Field of the Heart", pp. 95-96, Department of Electrical Engineering, 1963.

Y. Safonov et al., "Method of Recording the Magnetic Field of the Heart (Magnetocardiography)", pp. 1022-1024, Department of Internal Medicine, Voronezh Medical Institute, Voronezh Polytechnic Institute (Presented by the Academician V.V. Parin),vol. 64, Sep. 1967.

D. Cohen, Magnetic Fields Around the Torso: Production by Electrical Activity of the Human Heart, pp. 652-654, Science, New Series, vol. 156, Issue 3775, May 5, 1967.

D. Cohen, Magnetoencephalography: Evidence of Magnetic Fields Produced by Alpha-Rhythm Currents, pp. 784-786, Science, New Series, vol. 161, Issue 3843, Aug. 23, 1968.

D. Cohen, Detection and Analysis of Magnetic Fields Produced by Bioelectric Currents in Humans, pp. 1046-1048, Journal of Applied Physics, vol. 40, No. 3, Mar. 1, 1969.

D. Cohen et al., Magnetocardiograme Taken Inside a Shielded Room with a Superconducting Point-Contact Magnetometer, pp. 278-280, Applied Physics Letter, vol. 16, No. 7, Apr. 1970.

D. Cohen, Magnetoencephalography: Detection of the Brain's Electrical Activity with a Superconducting Magnetometer, pp. 664-666, Science, New Series, vol. 175, Issue 4022, Feb. 11, 1972.

M. Mäkijärvi et al., "New Trends in Clinical Magnetocardiography", pp. 410-417, Published prior to the filing of this application.

P.B. Alers, Structure of the Intermediate State in Superconducting Lead, pp. 104-108, Physical Review, vol. 105, No. 1, Jan. 1957.

A.A. Polyanskii et al., "Magneto-Optical Characterization Techniques", pp. 1551-1567, published prior to the filing of this application.

G.L. Fitzpatrick et al., "Magneto-Optic-Eddy Current Imaging of Subsurface Corrosion and Fatigue Cracks in Aging Aircraft", pp. 1159-1166, Review of Progress in Quantitative Nondestructive Evaluation, vol. 15,, 1996.

E. Yamasaki et al., "Three-Dimensional Magneto-Optic Near-Field Mapping Over 10-50 μm-Scale Line and Space Circuit Patterns", pp. 318-319, IEEE 2001.

M. Klank et al., "Sensitive Magneto-Optical Sensor for Visualization of Magnetic Fields Using Garnet Films of Specific Orientation", pp. 6484-6488, Journal of Applied Physics, vol. 92, No. 11, Dec. 2002.

J.R.A. Miranda et al., "A Novel Biomagnetic Method to Study Gastric Antral Contractions", pp. 1791-1799, Phys. Med. Biol. 42, 1997.

C. Bergemann et al., Magnetic Ion-Exchange Nono- and Microparticles for Medical, Biomedical and Molecular Biological Applications, pp. 45-52, Journal of Magnetism and Magnetic Materials 194, 1999.

Andreas Jordan, "Magnetic Fluid Hyperthermia (MFH): Cancer Treatment with AC Magnetic Field Induced Excitation of Biocompatible Superpramagnetic Nonoparticales", pp. 413-419, Journal of Magnetism and Magnetic Materials 201, 1999.

Ch. Alexion et al., "Magnetic Drug Targeting: Biodistribution and Dependency on Magnetic Field Strength", pp. 363-366, Journal of Magnetism and Magnetic Materials 252, 2002.

E. Romanus et al., Magnetic Nanoparticles Relaxation Measurement as a Novel Tool for in Vivo Diagnostics, pp. 387-389, Journal of Magnetism and Magnetic Materials 252, 2002.

* cited by examiner

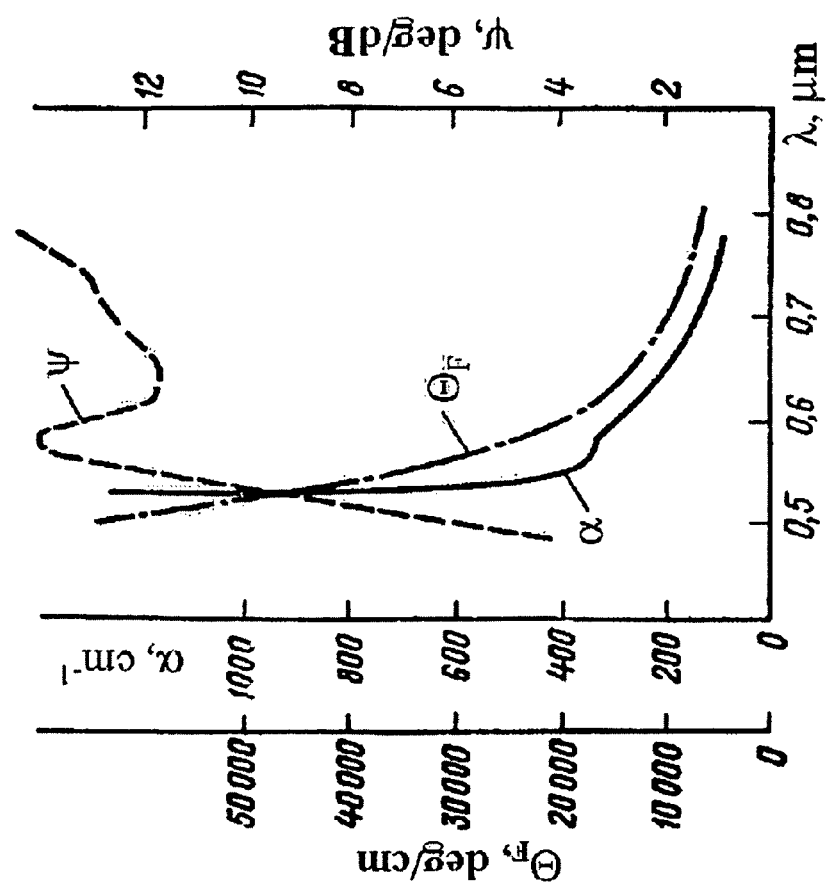
Figure 1. Dependence of Faraday rotation angle and absorption on wavelength

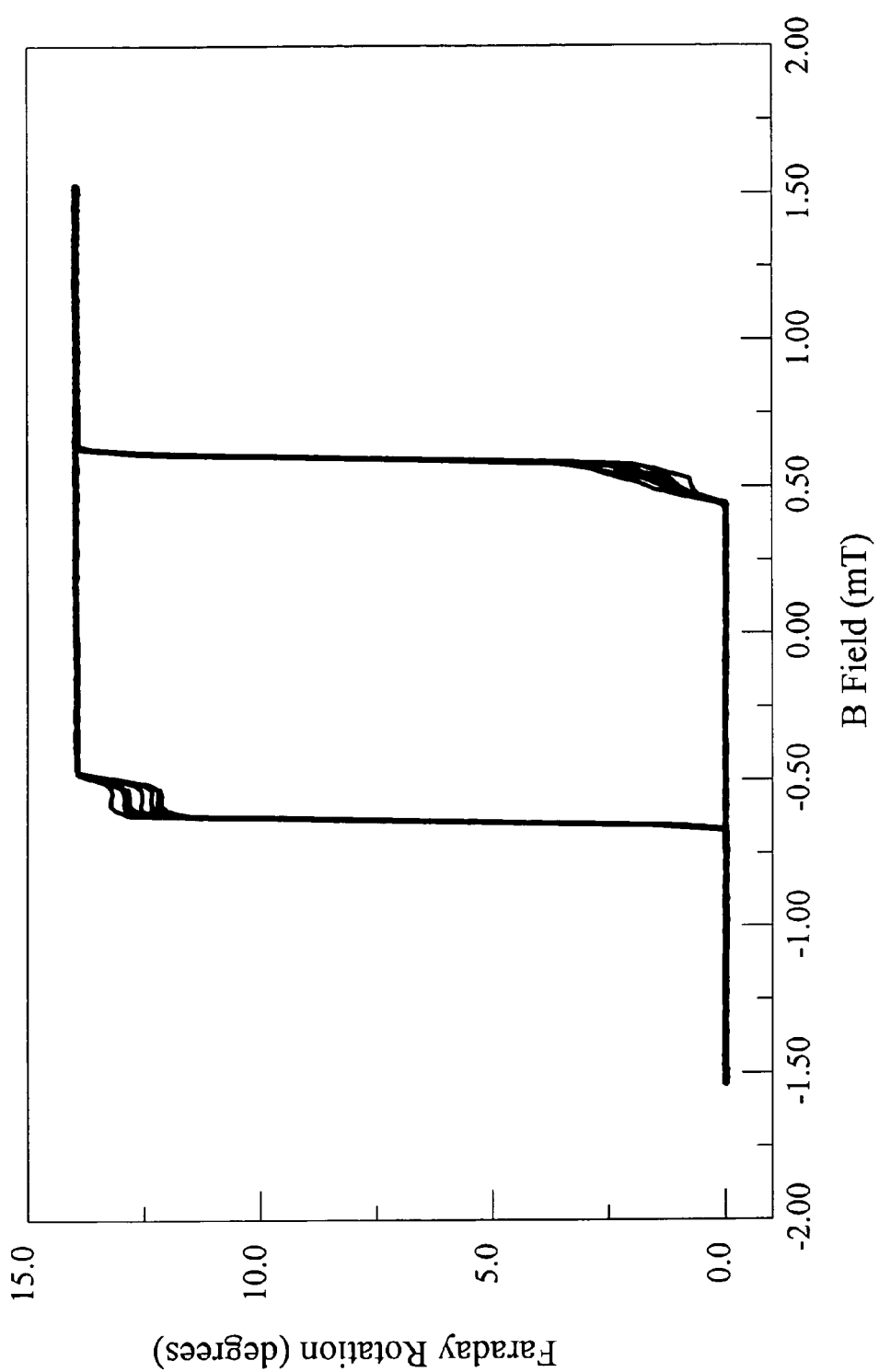
Figure 2. Magneto-optical hysteresis curve measured for YIG film at 10 Hz

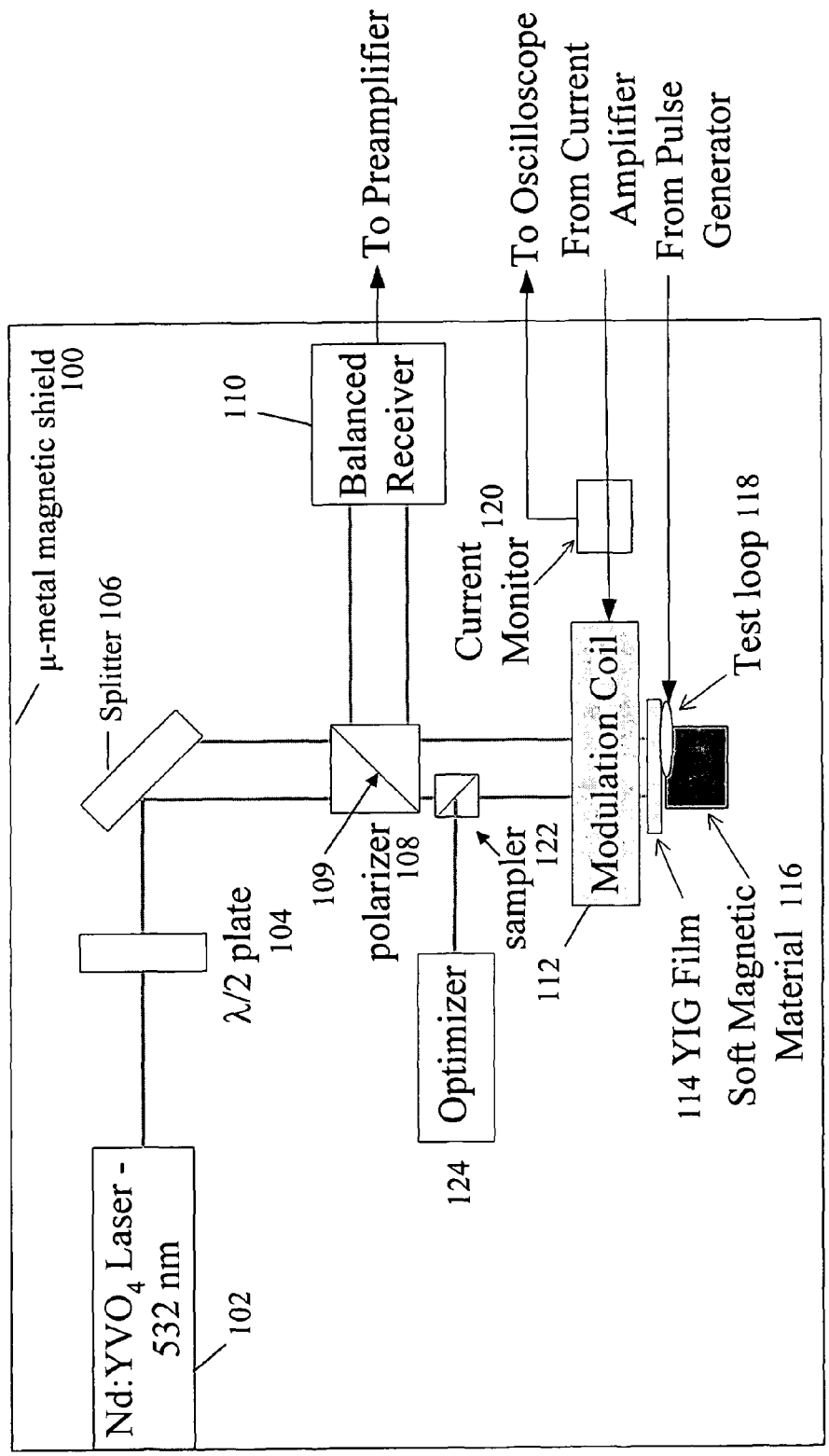
Figure 3. Experimental setup for magnetic field detection

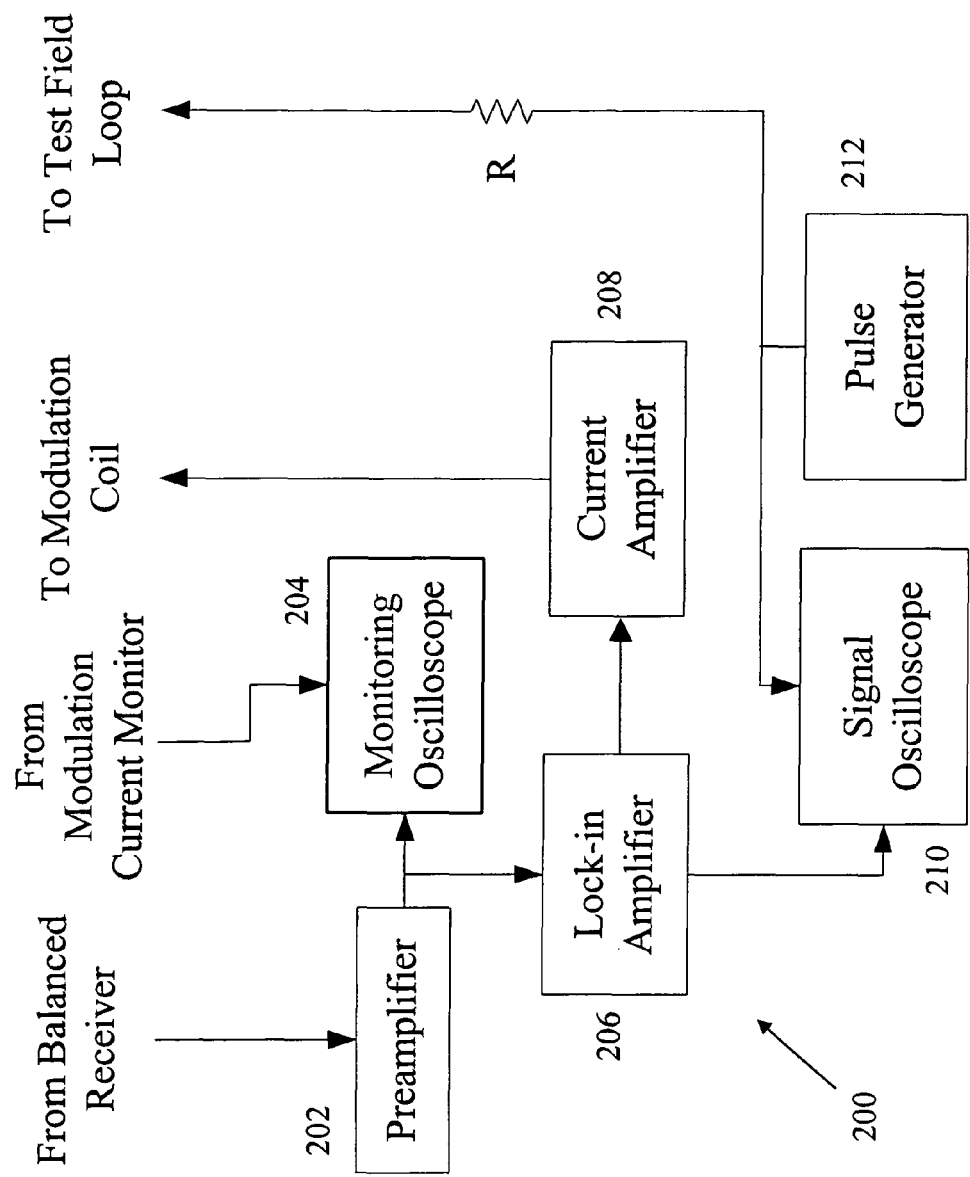
Figure 4. Electronic source and processing layout

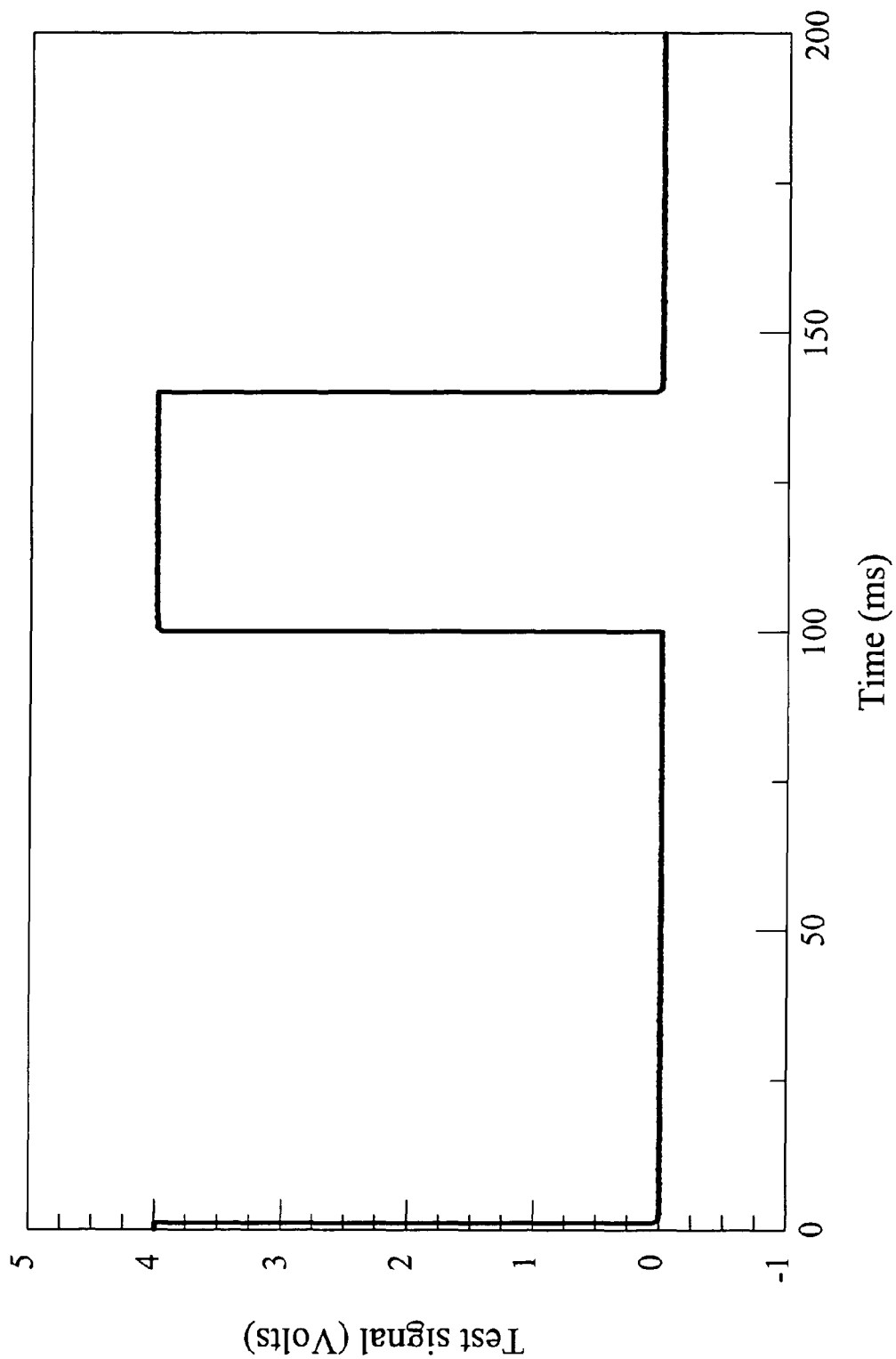
Figure 5. Output voltage waveform sent to test circuit

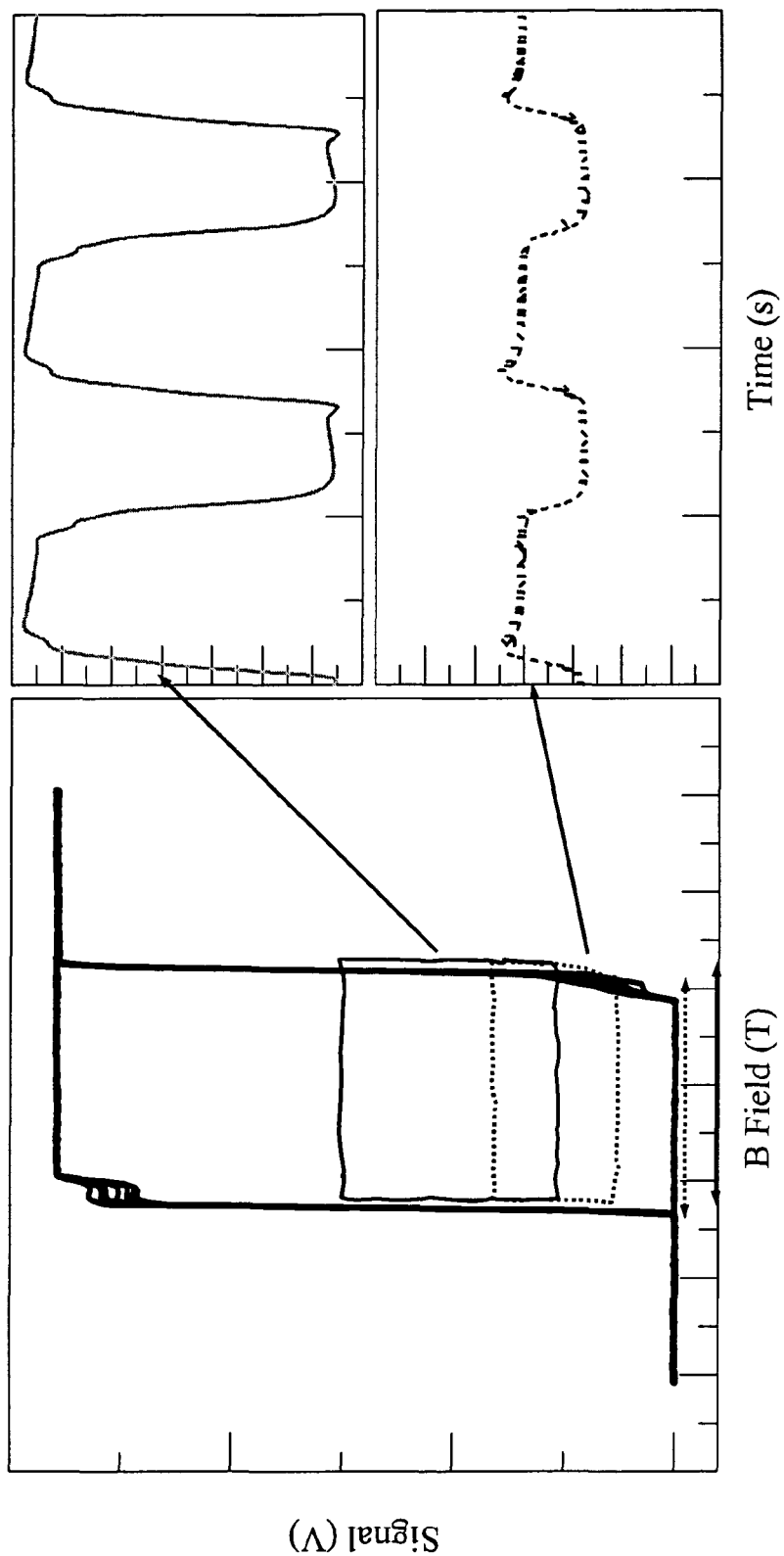
Figure 6. Illustration of how a DC shift (from solid to dotted arrow range) in the magnetic field causes an AC amplitude variation in the optical signal

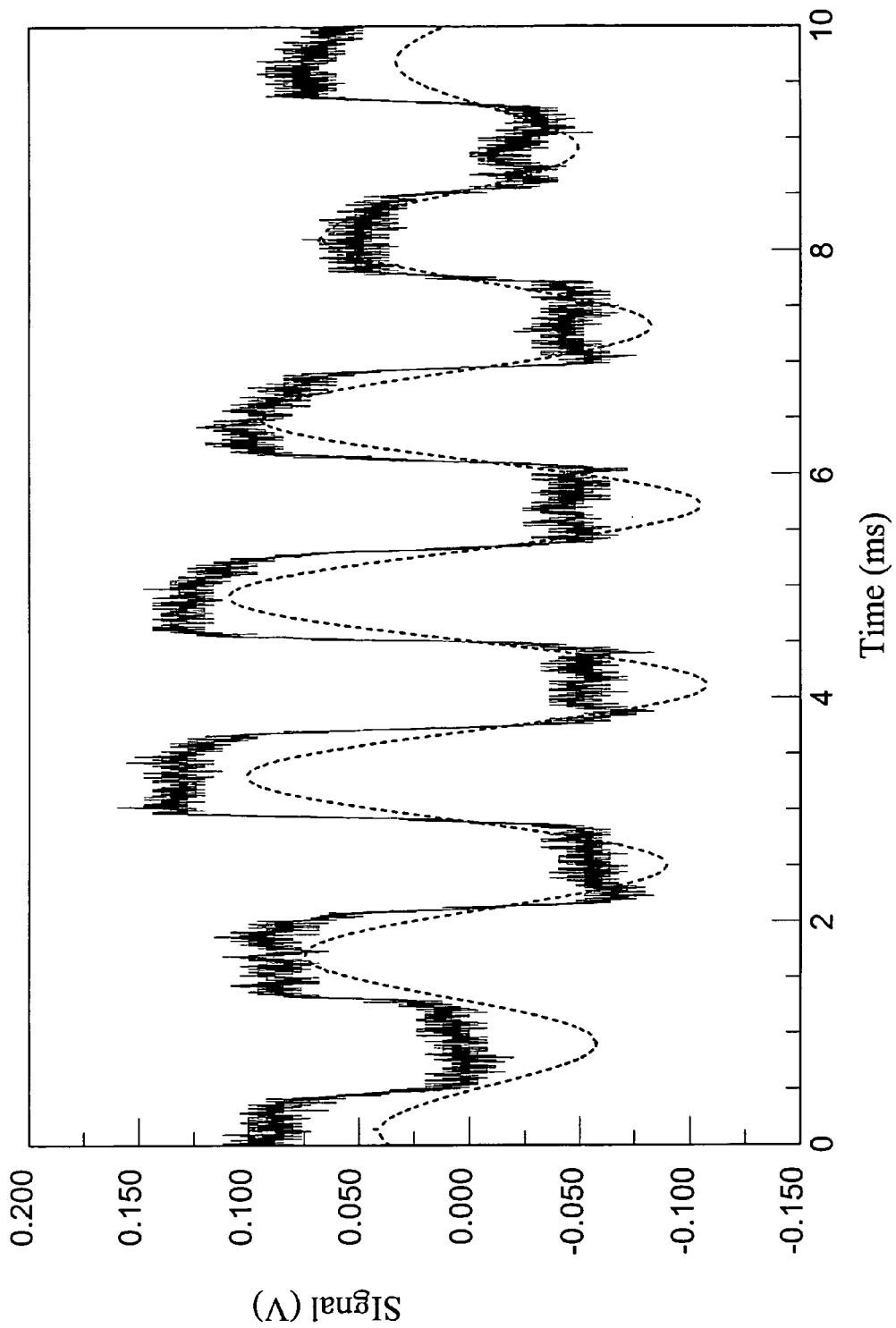
Figure 7. Unfiltered (solid) and filtered (dotted) signal waveforms

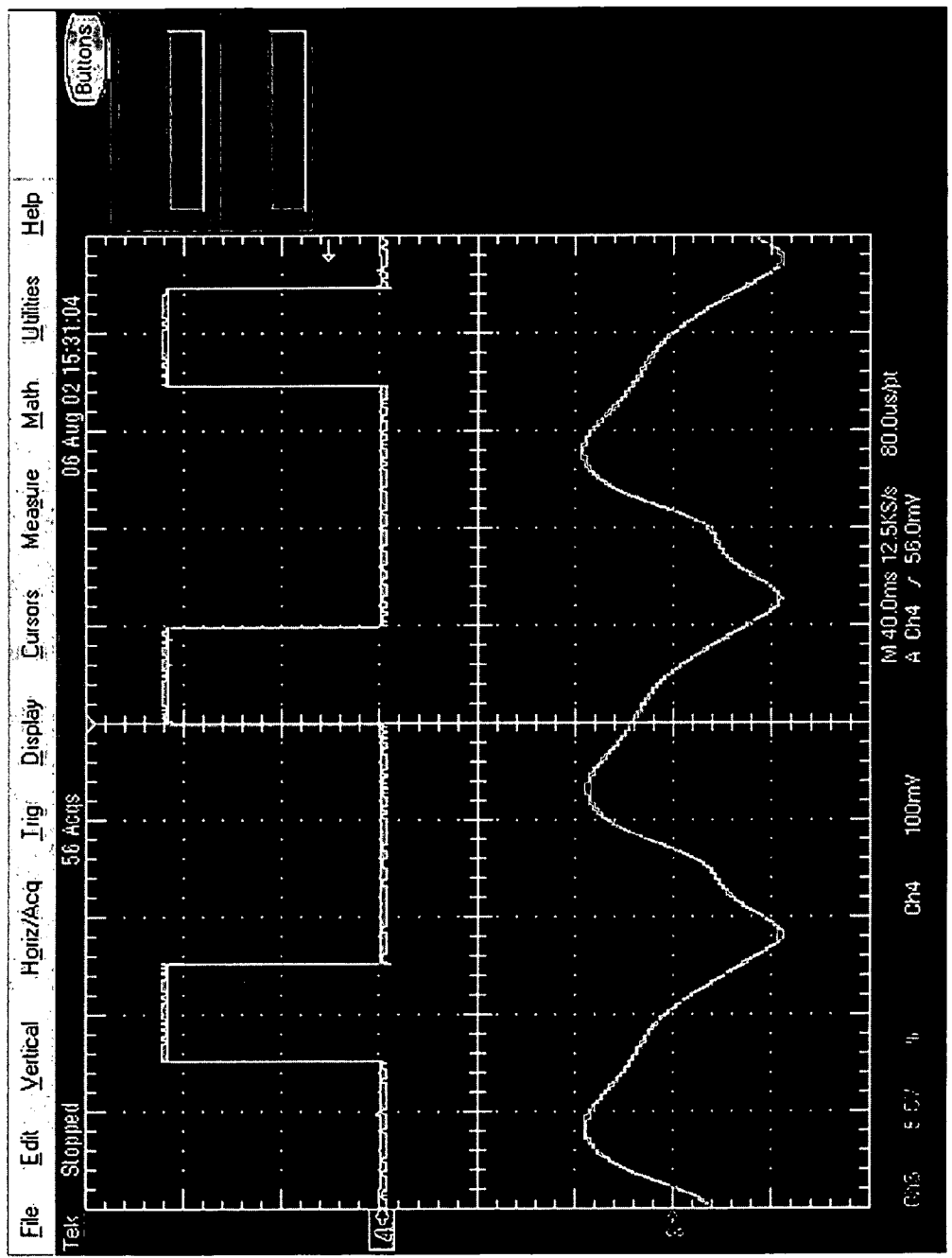
Figure 8. Screen capture of test voltage and detected signal waveforms

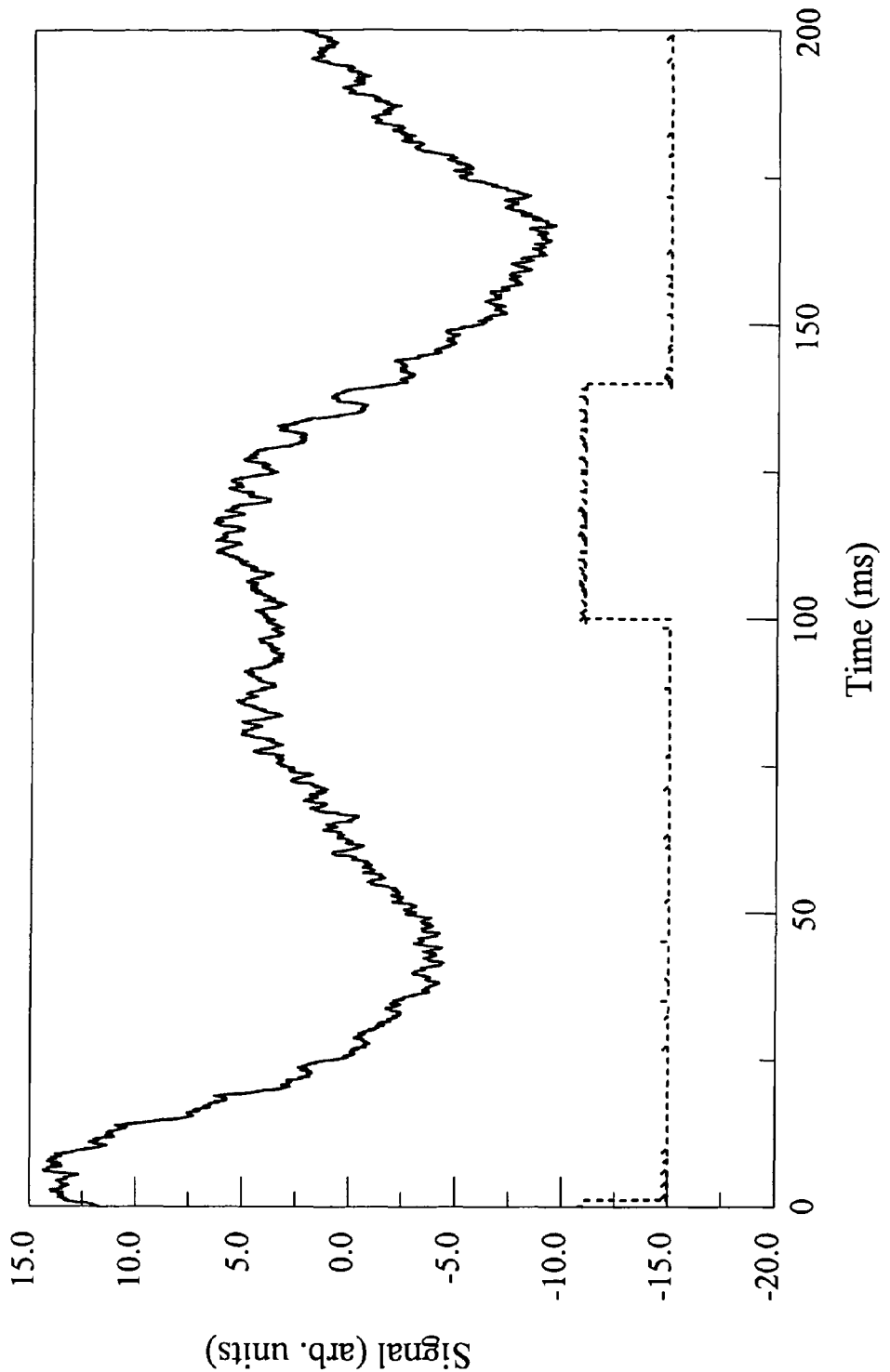
Figure 9. Test voltage (dotted) and detected signal (solid) for a test field of 103 pT

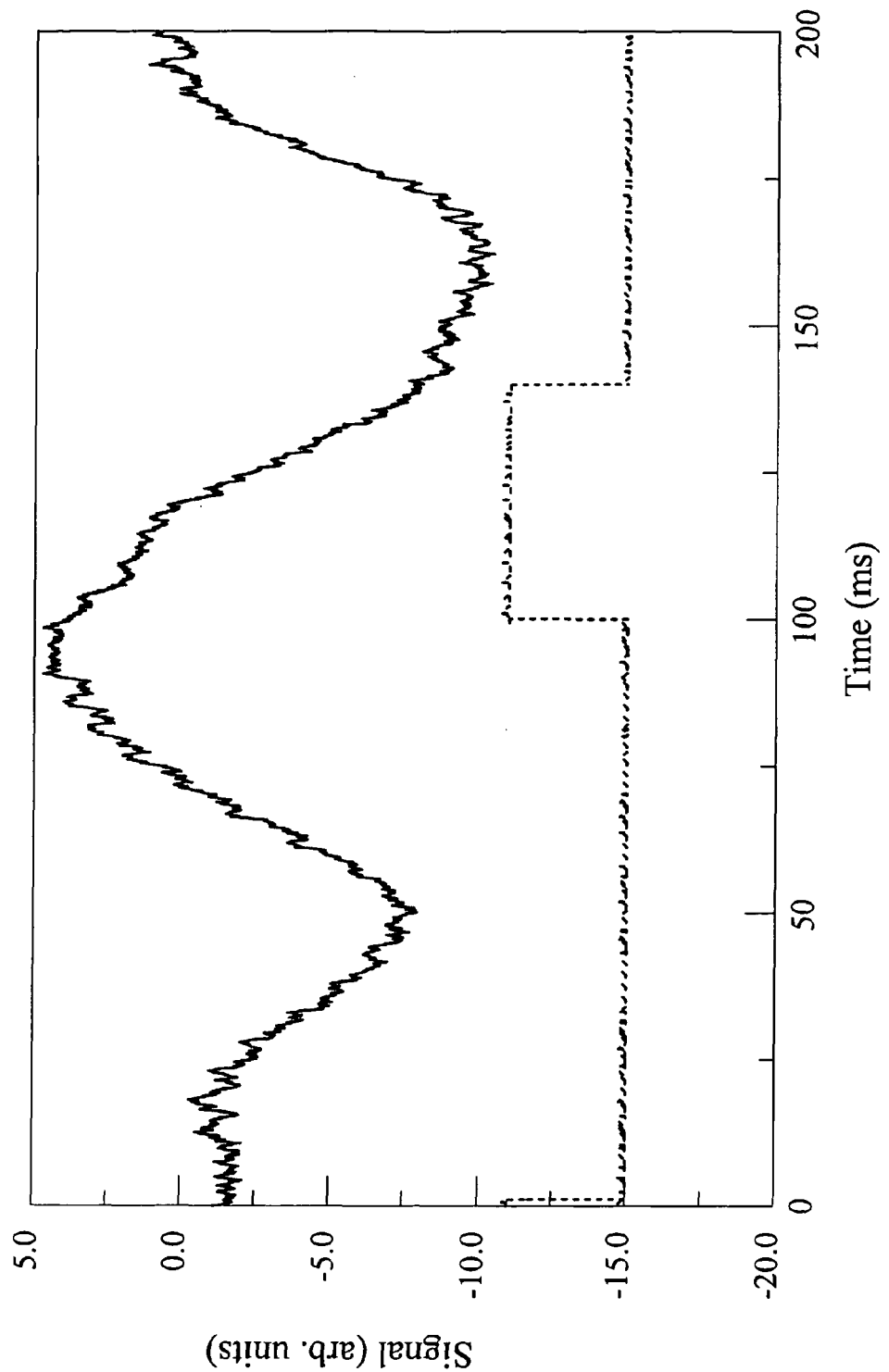
Figure 10. Test voltage (dotted) and detected signal (solid) for a test field of 8.4 pT

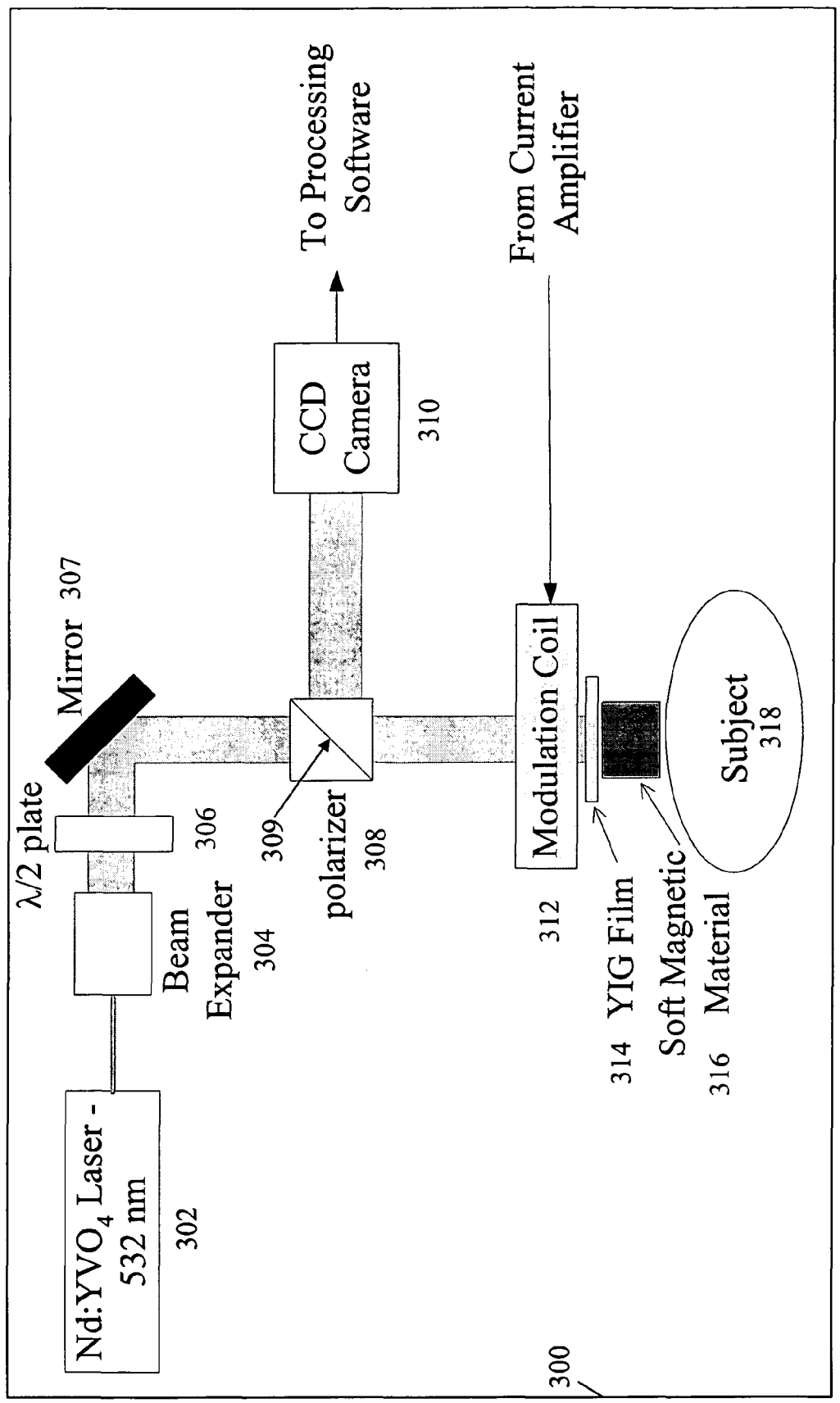
Figure 11. Imaging arrangement according to the second embodiment

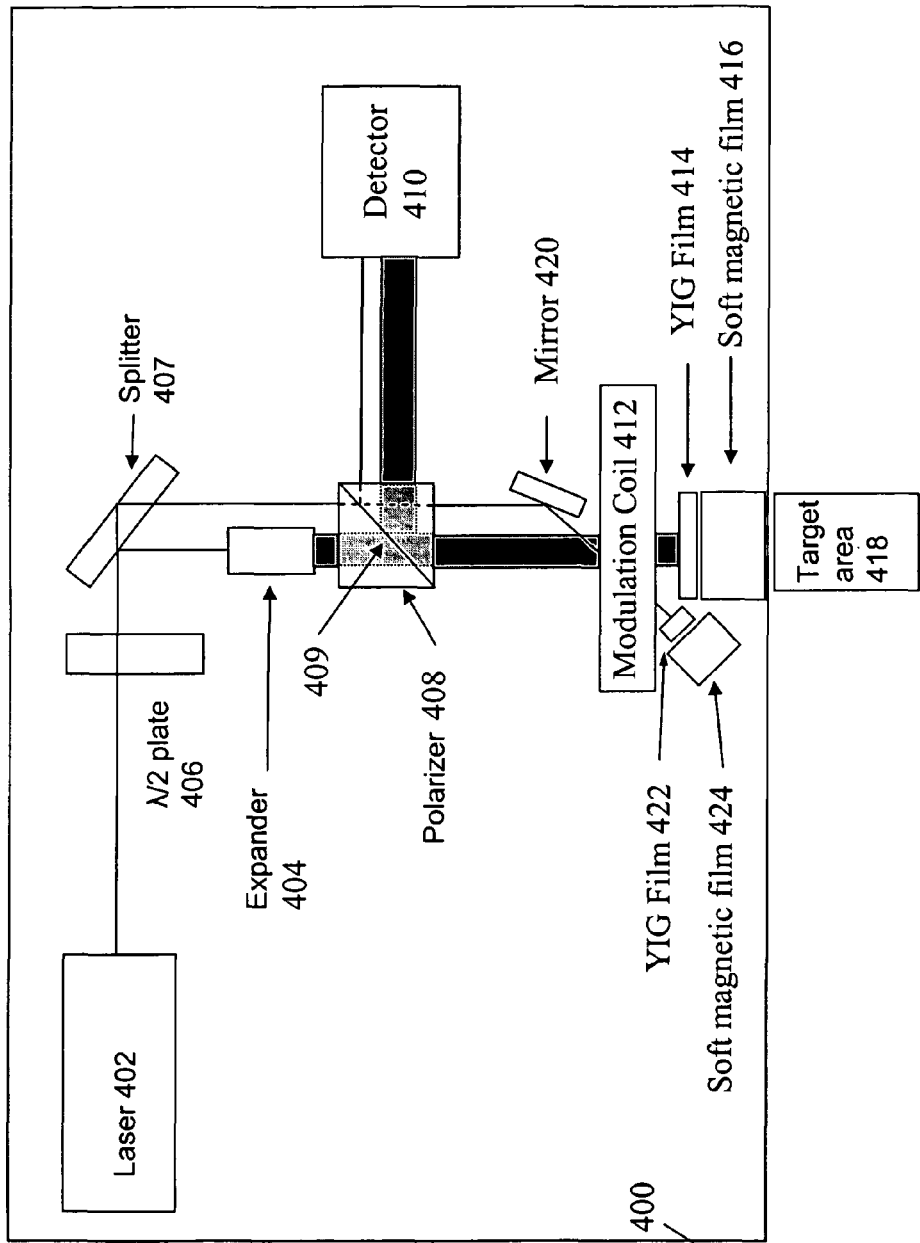
Figure 12. Imaging arrangement according to the third embodiment

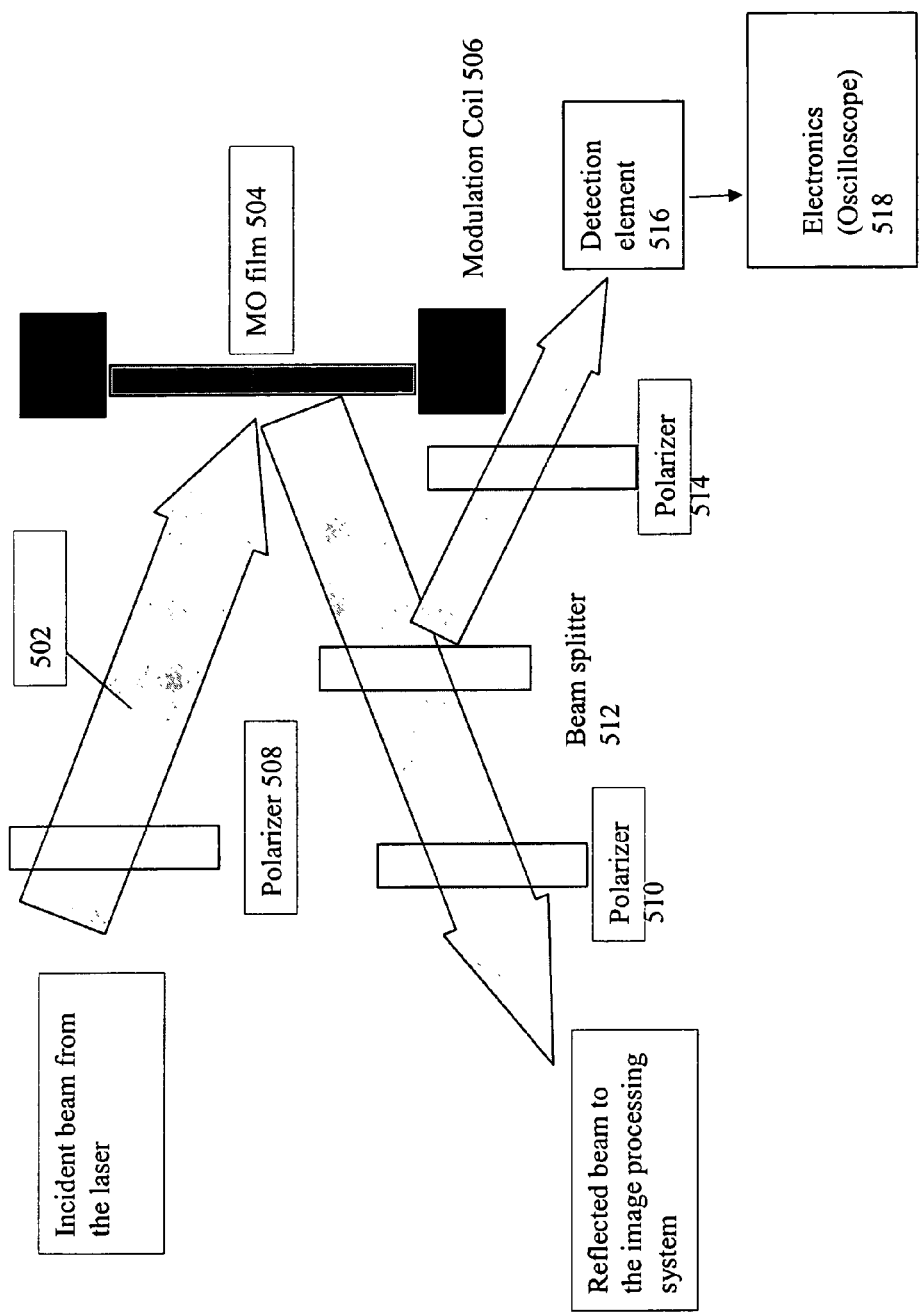
Figure 13. Diagram of optimization sub-system

MAGNETO-OPTICAL APPARATUS AND METHOD FOR THE SPATIALLY-RESOLVED DETECTION OF WEAK MAGNETIC FIELDS

FEDERALLY SPONSORED RESEARCH OR DEVELOPMENT

This invention was made with Government support under Contract F49620-99-1-0106 and Contract F49620-00-1-0372 awarded by the United States Air Force Office of Scientific Research (AFOSR). The Government has certain rights in the invention.

BACKGROUND

1. Technical Field

This invention relates to an optical detection apparatus and method of detecting electromagnetic fields. More particularly, this invention relates to a magneto-optical detection apparatus and method of detecting weak magnetic fields that offers a high degree of spatial resolution, and operates at room temperature.

2. Background Information

The ability to detect weak magnetic fields provides access to several important medical and industrial applications. Perhaps foremost among these is functional imaging in humans. Virtually all of the biomedical imaging modalities clinically available at present (MRI, CT, PET, ultrasound, etc.) are invasive (active) in the sense that each requires the patient to be irradiated, bathed in an intense (>1 T) magnetic field, or to ingest a radioactive substance. Furthermore, most of these modalities are quite expensive, requiring facilities such as magnets, large detector arrays, access to short-lived radioisotopes, or X-ray generators (which rely on high voltages) that are essentially immobile and within the financial means of only the larger medical centers and clinics. Finally, several prevalent modalities do not readily provide functional information.

Detecting the magnetic fields produced by various organs and systems is one of the few opportunities the human body offers to passively monitor its functions. In 1962, Baule and McFee demonstrated that the magnetic field produced by the human heart could be measured outside the torso with two large (~1 ft. in length) coils. They coined the term magnetocardiograph and suggested that imaging the heart's magnetic field might provide functional information. Eight years later, Cohen abandoned the use of coils for the detector in favor of the superconducting quantum interference device (SQUID) and observed the magnetic fields produced by the heart and brain (alpha rhythm; peak ~25 nG) with a detection floor of ~1 nG. Since Cohen's pioneering work, SQUID-based magnetocardiography (MCG) and magnetoencephalography (MEG) systems have been developed steadily and, as of July 2000, six SQUID systems having as many as 74 devices each had been constructed and were devoted to MCG research. Systems with much larger numbers ($\leq 256$) of devices are currently available and have proven to be valuable clinical tools for the diagnosis and study of a variety of neurological and cardiovascular conditions. Furthermore, biomagnetic susceptometry with SQUID magnetic detectors is a clinically-proven technique for measuring iron stores in the human body. However, MCG and MEG systems suffer from several obvious drawbacks. Foremost among these is the Josephson junction at the heart of the SQUID which requires cooling to liquid He (i.e., cryogenic) temperatures. Furthermore, the spatial resolution of the SQUID is limited by the device itself and its associated sensing loop to typically 1 cm$^2$, leading to a minimum 4 cm spacing between devices. Consequently, although MCG and MEG have proven to be successful in imaging the human heart and brain electrical activity (respectively), and measuring human tissue iron stores, SQUID technology is bulky and prohibitively expensive for small hospitals and rural clinics. Recently, sensitive magnetometers based on laser-excited metal vapors (such as rubidium) have been developed, but to date have not been applied clinically.

In summary, the only clinical tool that has been developed for MCG and MEG is the SQUID-based system. Despite its extraordinary sensitivity (detection floor of ~$10^{-15}$ T or ~10 pG), the barriers to widespread (e.g., low cost) use of this technology are formidable. Nevertheless, if an inexpensive technique for detecting and imaging the weak magnetic fields produced in humans became available, it would be a valuable clinical asset since the imaging process is non-invasive and inherently provides functional information. Not only would such a system be of value for low cost imaging of the magnetic fields produced naturally by various organs and systems of the human body but it would also be useful in tracking magnetic particles intentionally introduced to the human circulatory or intestinal systems, for example, for a variety of clinical purposes.

BRIEF SUMMARY

Embodiments of the present invention provide an inexpensive apparatus and technique for detecting and imaging weak magnetic fields, especially those produced in humans and animals, which is non-invasive and provides functional information. The optical apparatus and method presented here provides an inexpensive imaging system that has higher spatial resolution than that of conventional AC biosusceptometers and is significantly less expensive than SQUID-based MCG or MEG systems.

general, the detection apparatus includes a source of electromagnetic radiation, an alteration element that varies some characteristic of the electromagnetic radiation, a source of an alternating electromagnetic field that changes the amount by which the alteration element varies the characteristic of the electromagnetic radiation along with the electromagnetic field emanating from a subject, and a detector that detects the modified electromagnetic radiation. The alteration element has a response curve to an applied electromagnetic field which exhibits hysteresis, and thus transition regions, between stable states. The alternating electromagnetic field provided by the source of an alternating electromagnetic field has sufficient strength to switch the alteration element between the stable states. The detector is configured to detect the characteristic of the electromagnetic radiation that has been altered when the alteration element was in one of the transition regions.

More specifically, one aspect of the present invention utilizes the magneto-optical Faraday or Kerr effects to reliably detect weak magnetic fields. The polarization of a laser or other light source is altered by a magneto-optical element and the amount of polarization is subsequently detected.

BRIEF DESCRIPTION OF THE DRAWINGS

FIG. 1 is a graph showing the dependence of the Faraday rotation angle and absorption of a garnet film on the wavelength of incident light.

FIG. 2 is a magneto-optical hysteresis curve measured for a bismuth-doped garnet (YIG) film.

FIG. 3 is one example of a magnetic field detection system according to an embodiment of the present invention.

FIG. 4 is a block diagram of the electronic equipment used in the embodiment of FIG. 3.

FIG. 5 is a graph of the output voltage waveform sent to the test circuit of FIG. 4.

FIG. 6 illustrates how a DC shift (from solid to dotted arrow range) in the magnetic field causes an AC amplitude variation in the optical signal for the system of FIG. 3.

FIG. 7 illustrates signal waveforms that are unfiltered (solid) and filtered (dotted) by the lock-in amplifier.

FIG. 8 shows the test voltage and detected signal waveforms.

FIG. 9 is a graph of the test voltage (dotted) and detector signal (solid) for a test field of 103 pT for the embodiment of FIG. 3.

FIG. 10 is a graph of the test voltage (dotted) and detector signal (solid) for a test field of 8.4 pT for the embodiment of FIG. 3.

FIG. 11 is an arrangement according to a second embodiment.

FIG. 12 is an arrangement according to a third embodiment.

FIG. 13 is a diagram of the optimization sub-system.

DETAILED DESCRIPTION OF THE DRAWINGS AND THE PRESENTLY PREFERRED EMBODIMENTS

Numerous aspects of the present invention exist. For example, in one aspect, a detection apparatus to detect magnetic fields includes a magneto-optical element that exhibits a response, in the form of Faraday rotation, to an applied magnetic field, a hysteresis characteristic of the Faraday rotation exhibiting transition regions between a plurality of stable states. A light source emits light that impinges on the magneto-optical element. A modulation element applies a time-varying magnetic field of sufficient strength to switch the magneto-optical element between the stable states. A detector is configured to detect a change in the light caused by a reaction of the magneto-optical element to a magnetic field of a subject that occurred when the magneto-optical element was in one of the transition regions.

In a second aspect, the detection apparatus includes means for altering polarization of an optical signal. The polarization altering means exhibits a response, in the form of Faraday rotation, to an applied magnetic field. A hysteresis characteristic of the Faraday rotation exhibits transition regions between a plurality of stable states. The detection apparatus also includes means for emitting light that impinges on the polarization altering means as well as means for applying a time-varying magnetic field of sufficient strength to switch the polarization altering means between the stable states and means for detecting a change in the light caused by a reaction of the polarization altering means to a magnetic field of the subject that occurred when the polarization altering means was in one of the transition regions.

In a third aspect, the detection apparatus contains an alteration element having a response curve to an applied electromagnetic field. The response curve exhibits hysteresis between a plurality of stable states such that transition regions exist between the stable states and a source of electromagnetic radiation that impinges on the alteration element. An alternating electromagnetic field of sufficient strength to switch the alteration element between the stable states is applied to the alteration element, the alternating electromagnetic field. A characteristic of the electromagnetic radiation is altered depending on the alternating electromagnetic field and an electromagnetic field of a subject. A detector is configured to detect the characteristic of the electromagnetic radiation impinging on the detector. The electromagnetic radiation impinging on the detector has been altered when the alteration element was in one of the transition regions.

In a fourth aspect, a method of detecting magnetic fields includes providing an alteration element with a response curve to an applied electromagnetic field. The response curve exhibits hysteresis between a plurality of stable states such that transition regions exist between the stable states. The method also includes applying an alternating electromagnetic field to the alteration element of sufficient strength to alternate the alteration element between the stable states, altering a characteristic of electromagnetic radiation impinging on the alteration element such that the characteristic of the electromagnetic radiation exiting from the alteration element is different from that entering the alteration element by an amount dependent on the alternating electromagnetic field and an electromagnetic field of a subject, detecting the characteristic of the electromagnetic radiation that impinges on a detector, and generating a signal based on the characteristic of the electromagnetic radiation when the alteration element was in one of the transition regions.

In a fifth aspect, the method includes providing a magneto-optical element that exhibiting a response, in the form of Faraday rotation, to an applied magnetic field. A hysteresis characteristic of the Faraday rotation exhibits transition regions between a plurality of stable states. The method also includes emitting light from a light source that impinges on the magneto-optical element, applying a time-varying magnetic field of sufficient strength to switch the magneto-optical element between the stable states and detecting a change in the light caused by a reaction of the magneto-optical element to a magnetic field of the subject that occurred when the magneto-optical element was in one of the transition regions.

Other aspects of the present invention exist in addition to the above aspects. In one or more of these aspects, the detection apparatus or method may measure a magnetic field of an organ or bodily system of an animal. The animal may be a human and/or the organ or bodily system may comprise the heart. A cardiac pulse waveform may be detected and a trigger pulse transmitted to initiate detection. Magnetic particles introduced intentionally to the animal may be tracked, and/or iron tissue stores, skeletal muscle, and/or the abdominal cavity, for example, may be measured. A magnetic field internal to the magneto-optical element caused by the magnetic field of the subject may be of sufficient strength to rotate polarization of the light by at least about $10^{-4}$ degrees. An applied magnetic field of less than about 10 G may be sufficient to switch the response of the magneto-optical element between the stable states. A measurable change in the light may be obtained if the magnetic field of the subject applied to the magneto-optical element is less than about 100 pT. The modulation element may apply a time-varying magnetic field of frequency substantially higher than 60 Hz.

Further, a magnetic material having a high permeability may be disposed sufficiently close to the magneto-optical element to amplify an internal magnetic field in the magneto-optical element formed by an external magnetic field impinging on and penetrating the magneto-optical element. The detector may be configured in a gradiometer arrangement to subtract a background signal from a target signal supplied from the magneto-optical element affected by the magnetic field of the subject. In this case, the detection apparatus may further comprise a second magneto-optical element upon which the light impinges and that is affected substantially the same as the first magneto-optical element by the time-varying magnetic field, with the second magneto-optical element configured to be substantially unaffected by the magnetic field of the subject and supplying the background signal. The first magneto-optical element may have an area that is about as least as large as a source of the magnetic field of the subject and/or the first and second magneto-optical elements may be formed from the same material and have substantially identical response characteristics. The detection apparatus may require at most a standard line voltage and/or may not require cooling water.

Similarly, the detection apparatus may comprise a trigger configured to detect an initialization signal from a source of the magnetic field of the subject and transmit a trigger pulse to the detector. The signal may be generated by the detector only from light from the magneto-optical element when the magneto-optical element was in one of the transition regions. The detection apparatus may comprise shielding to shield components of the detection apparatus from sources of electromagnetic radiation causing noise in the components. The shielding may be configured to additionally shield a source of the magnetic field of the subject or specifically to exclude a source of the magnetic field of the subject. The detection apparatus may comprise a vibration-isolating platform on which components of the detection apparatus are disposed. The vibration-isolating platform may be large enough to additionally hold a source of the magnetic field of the subject.

The magneto-optical element in these aspects may comprise a doped YIG thin film having a thickness that is less than about three microns. The YIG film may be doped with at least Bi and/or formed from amorphous or single crystal material. The excitation source may be a laser. The detection apparatus may comprise a single nonmagnetic frame upon which optical components of the detection apparatus are mounted. A shield of μ-metal may enclose the frame. The detection apparatus may comprise an expander to enlarge an area of light from the light source impinging on the magneto-optical element. The modulation element may be configured to apply a time-varying magnetic field of high frequency during detection and a low frequency field to remagnetize the magneto-optical element. The detection apparatus may comprise an optimization apparatus to optimize the hysteresis characteristic such that an operating point is substantially maintained. The operating point may provide maximum magnetic field sensitivity. The optimization apparatus may adjust at least one of an amplitude and a frequency of the time-varying magnetic field to substantially maintain the operating point. The optimization apparatus may further comprise a detection element that detects the response of the magneto-optical element and transmits an optimization signal to optimization electronics that measure a slope of the transition region near the operating point and provide feedback to the modulation element to adjust the time-varying magnetic field. The optimization apparatus may monitor the hysteresis characteristic of the magneto-optical element and adjusts the time-varying magnetic field only if the hysteresis characteristic has changed by a predetermined amount.

Although the above aspects refer to only the magneto-optical element specifically, the alteration element or polarization altering means may be used depending on the aspect of the invention. Similarly, other elements in the different aspects may be substituted as desired, for example, the modulation element and the means for applying a time-varying magnetic field.

Although magneto-optical detection of magnetic fields with thin films has been currently applied commercially to the nondestructive evaluation of aircraft components and electrical circuits, the drawback of current techniques is that the sensitivity has been limited to detection of magnetic fields on the order of 10 G. Detecting human organs and systems requires considerably higher sensitivity. The human heart and abdominal system, for example, are known to produce peak magnetic field strengths of ~1 μG whereas skeletal muscle generates peak values of ~0.5 μG. Therefore, the apparatus and technique described here is considerably more sensitive than currently-available schemes based on the Faraday effect in thin films. Furthermore, the detection apparatus operates typically at frequencies of several kHz which is well above the frequency range of 1-30 Hz at which some conventional systems function—a frequency region in which the detection process is most susceptible to ambient electromagnetic interference. The large increase in sensitivity offered by the present invention is realized by operating the detection system in the transition region of a magneto-optical film's hysteresis curves that separates the two stable magnetization states.

Thus, in this aspect, the apparatus and method exploits the transition region between two magnetization states of a magneto-optical film to produce a low cost, highly sensitive magnetic detector that operates at room temperature. The magnetic field of a subject is determined by examining the polarization of light reflected from the magneto-optical film, because the polarization of the incident optical beam is rotated by an angle that is proportional to the strength of the magnetic field present. A several μm thick, bismuth-doped, garnet film serves as the detector as the transition regions are sufficiently steep to provide large changes in the polarization rotation angle for small variations in the applied magnetic field.

The present apparatus and method permits the detection of weak magnetic fields, on the order of 10-50 picoTesla (pT) or less, and the generation of images of the magnetic field. A weak magnetic field is herein defined to be the magnetic field produced by the human body or various organs/systems in the human body. The apparatus and method takes advantage of the Faraday effect present in magneto-optical films. This apparatus and method may be used in different applications, including MCG imaging or both temporal and spatial tracking of magnetic particles introduced intentionally to a human or other animal for diagnostic purposes. Such magnetic micro and nano particles (typically Fe-based) are increasingly being applied to clinical diagnostics and treatment, including gastroenterology, drug and cell targeting, and in vivo diagnostics. A number of advantages exist in using the magneto-optical apparatus and method described herein: the apparatus/method is relatively inexpensive, non-invasive, has a high spatial resolution, and is simple to operate, among others.

A magneto-optical technique exploiting the Faraday effect has been utilized previously in various applications unrelated to the medical field. One example of its value in research is the application of the technique to investigating the magnetic flux and eddy currents of high temperature superconductors. Commercial applications of magneto-optical detection include the detection of subsurface cracks in aging aircraft and, more recently, the imaging of small features (tens of microns) in integrated circuits.

In applying magneto-optical imaging to non-destructive subsurface crack detection in aging aircraft, a current flowing through the surface of an aircraft component (such as a wing) generates eddy currents at abnormalities such as cracks or regions of excessive strain. These currents, in turn, radiate magnetic fields having a component perpendicular to the surface of the metal. The resulting magnetic fields are imaged by placing a magneto-optical film sensor close to the surface of the aircraft component under test, and the images are studied to identify potentially dangerous wear in the component. However, this magneto-optical technique cannot be applied to imaging in the human body because of insufficient sensitivity.

As mentioned previously, magneto-optical imaging has also been applied to understanding the physics of high-temperature superconductors. More specifically, Yttrium Iron Garnet (YIG) thin films are deposited onto the surfaces of superconductors and the flux patterns, which correspond to eddy currents inside the superconductors, are then imaged.

Similar comments could be made for the application of conventional magneto-optical techniques to imaging features in integrated circuits by detecting the magnetic fields generated by current in the circuit components. Such images are vital for determining if a chip is operating properly.

The most daunting barrier to the application of magneto-optical imaging to magnetocardiography and other high-sensitivity imaging is that none of the conventional magneto-optical imaging techniques using thin films have attained the sensitivity required for magnetocardiography imaging. In particular, conventional magneto-optical detection techniques require strong fields (on the order of mT, or about 10 G), which are roughly seven orders of magnitude larger than those produced by the human heart. One reason for the severe limitation in detection sensitivity with existing magneto-optical systems is that they universally rely solely on the two stable magnetization states of the film. In the present apparatus and method, a magneto-optical thin film, such as a Bi-doped YIG film, coupled with the dynamic, synchronous detection technique described below, may be used to provide the required sensitivity.

The Faraday effect describes the degree to which a material will rotate the polarization of light incident on the material, in response to a magnetic field interacting with that material. The Faraday rotation angle $\Delta\Theta_F$ is given by:

$$\Delta\Theta_F = V \int_d^v \vec{B} \cdot d\vec{l} \quad (1)$$

where V is the Verdet constant for the material, B is the applied magnetic field, and d is the thickness of the medium along the direction in which the incident optical beam propagates. For a uniform applied magnetic field, (1) simplifies to:

$$\Delta\Theta_F = VBd. \quad (2)$$

Many materials exhibit some degree of Faraday rotation. Optical fibers, for example, may be used to detect magnetic fields through the use of the Faraday effect. Any effort to apply fibers to magnetic imaging, however, faces several difficulties, including the need to integrate over a lengthy section of fiber in order to realize a measurable effect.

One of the advantages of doped YIG films (for example) is that a thickness of only a few microns of material is necessary to yield a significant Faraday rotation angle. Since only a thin film of the material is needed, magnetic fields may be imaged with high resolution in the axis normal to the film plane. In other words, the thin film magneto-optical detector is essentially planar. FIG. 1 shows the characteristics of a typical magneto-optical YIG film, including the dependence of the Faraday rotation angle ($\Theta_F$) and film absorption ($\alpha$) on the wavelength of incident light. Another advantage of magneto-optical YIG films is their relative transparency (an absorption coefficient of less than about 1000 cm$^{-1}$) at optical wavelengths. This permits a relatively low power, small, and inexpensive light source to be used.

More specifically, the magneto-optical films preferably used are amorphous, single crystal, or polycrystalline Bi-doped YIG thin films. These films are typically grown on garnet substrates.

Due to the ferrimagnetic nature of YIG material, the optical response of the magneto-optical YIG film to a magnetic field applied along the magnetization axis displays strong hysteresis. In this case, the magnetization axis is normal to the film plane. FIG. 2 presents a typical hysteresis curve for a Bi-doped YIG film for a laser wavelength of 532 nm. These measurements were made by applying a low frequency (10 Hz) sinusoidal magnetic field to the film and recording the optical response (Faraday rotation) with a polarizer and photodetector. The intensity variation of the optical response is described by:

$$\Delta I = I_0 \sin^2 \Delta\Theta_F \quad (3)$$

where $I_0$ is the intensity of the linearly polarized light incident on the film, assuming the polarization of the incident light beam is crossed with respect to a second polarizer when no Faraday rotation is observed. Notice from FIG. 2 that the film has two preferred magnetization states (denoted I and II) and the sharp transition from one state to the other occurs at a threshold applied magnetic field of roughly 0.5 mT (or 5 G) and −0.7 mT. Virtually all existing magneto-optical detection schemes in films rely solely on the magneto-optical medium being in one of its two stable states. Consequently, the sensitivity of such systems is inherently limited to field strengths on the order of Gauss.

However, it is also clear from FIG. 2 that the response of the film in the transition region between the two magnetization states has a steep slope, thereby offering large changes in response (e.g., polarization rotation angle) for small variations in the applied magnetic field. Such a response is precisely what one is seeking if a sensitive magnetic field detector is desired. However, operating continuously in either of the two transition regions is no easy task since the film prefers to be in one of the binary magnetization states. One solution to this problem is to subject the film to a modulated magnetic field (which rapidly switches the film between its two stable states) and activate the detection system only during the two brief time periods in each hysteresis cycle during which the film is passing through the transition region.

The maximum sensitivity of the film available with such a technique can be estimated by normalizing the film response to a Faraday rotation angle and, given the minimum detectable rotation angle (based on polarizer extinction ratios), the minimum field detection limit can be found. For example, a simple calculation using data from one Bi-doped YIG film shows that the slope of the hysteresis curve during the transition between states is typically 1 degree/400 nT (about 5-10×10$^7$ deg T$^{-1}$ or roughly 10$^4$ deg/G). Using the extinction ratio of a conventional polarizer (5×10$^5$:1) to determine the minimum detectable angle of rotation, the minimum field that is detectable, assuming the ability to detect an angular rotation of 10$^{-4}$ degrees, is approximately 40 pT, or less than one half the peak field of the human heart. Thus, an apparatus formed with standard, commercially available optical components (albeit arranged differently) is sufficiently sensitive for MCG, and specialized components will decrease the detection "floor" further.

One example of a single-point detection experimental apparatus, used to evaluate the technique, and its associated electronic equipment are shown in FIGS. 3 and 4, respectively. FIG. 3 illustrates an embodiment of the optical detection arrangement. The apparatus is preferably inside an electromagnetically shielded enclosure 100 to decrease the noise that interferes with the detector. FIG. 4 is a block diagram of the electronics 200 which provides source signals to the appropriate elements inside the space 100 and processes the signals from the receiver 110.

More specifically, the shield 100 consists of any material or set of materials that adequately isolate the apparatus electromagnetically. In the arrangement of FIG. 3, copper screen and a layer of µ-metal affords sufficient isolation. Thus, the shield may be a means for shielding components of the detection apparatus from sources of electromagnetic radiation causing noise in the components. However, the electromagnetic shielding may not be necessary if a gradiometer configuration of the magneto-optical detector is employed, as described below.

The wavelength emitted by the electromagnetic source 102 is selected by considering different criteria. These criteria include, for example, the amplitude stability of the source and a wavelength that balances the absorption of the magneto-optical film with the magnitude of the Faraday rotation angle of the film at that wavelength. In the embodiment of FIG. 3, a diode-pumped, continuous frequency-doubled $Nd:YVO_4$ laser (for example, commercially available from Spectra Physics Inc. of Mountain View, Calif.) was adopted as the electromagnetic source 102 because it has excellent amplitude stability and, at its operating wavelength (532 nm), the Bi-doped YIG film (for example, made by Litton Airtron of Charlotte, N.C. using liquid epitaxial growth deposited on about a 1 mm GGG glass—although essentially a Bi-doped YIG film from any conventional Faraday isolator may be used) exhibits a relatively small amount of absorption but yet a large Verdet constant. Furthermore, as only a modest (no more than 100-200 mW) laser power is required, a relatively compact and inexpensive laser may be used (incoherent light may be able to be used as well as coherent light). As seen in FIG. 3 (as well as the arrangements of FIGS. 11 and 12), an additional advantage of the arrangement is that the apparatus is non-invasive in the sense that the object to be measured is not exposed to light from the laser. More generally, the electromagnetic radiation supplied by the source 102 can have a wavelength in the visible, ultraviolet or infrared regimes, depending on the desired characteristics described above. In this arrangement, the source 102 is a means for emitting electromagnetic radiation, especially electromagnetic radiation in the visible spectrum.

In the arrangement of FIG. 3, the beam from the laser 102 passes through a half-wave plate 104 and is incident on a splitter 106, which serves to separate the original beam into two distinct beams. The splitter 106 may be as simple as a thick glass plate, in which the separation into two different beams occurs by taking advantage of the fact that approximately 4% of the original beam is reflected at each air-glass interface. The amount of light reflected by each interface may be altered by adding one or more coating layers to either or both faces of the splitter 106. For example, one or more layers that are substantially reflective at the wavelength being used (such as a silver coating or multi-layer dielectric structure) may be applied to the face of the splitter on which the light impinges after having passed through the splitter 106 (the face distal from the laser) while the opposing face remains uncoated (the face proximate to the laser).

The laser beam 102 also passes through a sampler 122 and impinges on an optimizer 124, as discussed below. The sampler 122 redirects a portion of the laser beam 102 to electronics in the optimizer 124. Although not shown in the other figures, the sampler and optimizer may be present in the other embodiments and is described more fully in FIG. 13. The sampler may be provided to sample either laser beam, the beam affected by the weak magnetic field or the beam not affected by the weak magnetic field.

After leaving splitter 106, the two beams then pass through a linear polarizer 108 (for instance polarizers made by CVI Laser, LLC of Albuquerque, N. Mex.) which has a nominal extinction ratio of about $5\times10^5:1$. These beams are incident on the YIG film 114, essentially perpendicular to the surface of the film 114. Thus, in this arrangement, the YIG film 114 is a means for altering the polarization of the optical signal that exhibits a response, in the form of Faraday rotation, to an applied magnetic field, and the hysteresis characteristic of the Faraday rotation exhibits transition regions between a plurality of stable states. One of the beams, the signal beam, impinges upon the film 114 at a position where the film 114 is significantly affected by the magnetic field produced by the test loop 118 (the detection point). The other beam, the background beam, impinges upon the film 114 at a position where the film 114 is relatively unaffected by the test loop 118.

The film 114 is deposited on a substrate through any of a number of processes and may be grown specifically for this purpose, or purchased commercially such as from Litton Airtron-Synoptics Group of Charlotte, N.C. The film 114 used in FIG. 3 was over-coated with an antireflection film and a dielectric mirror with a reflectance of >99% at 532 nm (the wavelength of the laser 102) on the back side of the film's substrate. Therefore, the amount of incident light reflected by the film 114 is virtually eliminated. Substantially all of the light passes through the film 114 and is incident on the substrate side of the film 114, where it is reflected back towards the polarizer 108. As the light traverses the film 114, its polarization is rotated. From Equation (2), the degree of rotation for the signal beam is dependent upon the thickness of the film 114 and the strength of the magnetic field generated by the test loop 118. For the background beam, the degree of polarization rotation is not dependent on the field generated by the test loop 118.

The modulating coil 112 provides a magnetic field which normally varies sinusoidally with time, although other periodic waveforms may be used. Thus, the modulating coil is one means for applying a time-varying magnetic field of sufficient strength to switch the polarization altering means (which may be the film 114) between the stable states. A PEAVEY PV 500 power amplifier was used to boost the current supplied to the modulating coil 112 in order to drive the magnetic field. Immersing the film 114 in the time-varying field produced by coil 112 causes the magneto-optical response of film 114 to switch back and forth between the two stable magnetization states discussed earlier. The current to the modulation coil is supplied by a waveform generator and a current amplifier.

The soft magnetic material 116 placed behind the film 114 in FIG. 3 has the effect of amplifying the modulation and test fields based on the permeability characteristics of the material. The soft magnetic material 116 effectively increases the sensitivity of the overall system as amplifying the test field allows it to be detected as long as the test field is amplified to a level sufficient to cause a detectable amount of Faraday rotation of light passing through the film 114. The type of soft magnetic material 116 may be determined by the particular film 114 being used, in addition to other factors, but a definite increase in sensitivity occurs when materials with a high permeability are placed close to the detection point on the YIG film 114. Such a technique lowers the detection limit of the overall system by at least a factor of two.

After the two beams pass through the film 114, they are reflected back along the incident path and re-enter the polarizer 108. The portions of both beams having a polarization component perpendicular to the incident beam polarization are reflected by a 45° surface 109 inside the polarizer 108 and exit the polarizer 108 along a path substantially perpendicular to the impinging light path. The beams then enter a balanced receiver 110 (for example, a Nirvana balanced receiver from New Focus, Inc. of Santa Clara, Calif.). Although not shown in FIG. 3, two different polarizers may also be used (instead of one polarizer 108 containing an angled surface 109), with the beams impinging on the film 114 at an angle of about 45° (for example), reflected toward the second polarizer, and then entering the balanced receiver 110.

The balanced receiver 110 detects the two beams with photodetectors that are highly responsive at the wavelength of the light source 102. The signal from the receiver 110 is proportional to the difference in the intensity between the two incident beams at any given instant of time. Therefore, this system is a balanced design and is adjusted such that no signal is produced by the receiver in the absence of a test field.

A schematic diagram of one embodiment of the electronics for controlling the optical system of FIG. 3 and processing the signal is given in FIG. 4. After amplification by a preamplifier 202, the signal from the balanced receiver 110 (FIG. 3) is delivered to a lock-in amplifier 206 (for instance an EG&G 7260 DSP lock-in amplifier of Gaithersburg, M.d.). The reference frequency for the lock-in amplifier is provided by diverting a portion of the driving signal supplied to the modulation coil 112 by the low noise current amplifier 208. Detectors, other than the lock-in amplifier, may be used. These detectors detect light from the film. The signal from the film may be accepted only during the period of time when the film is in the transition regions. One example of such a detector may be a boxcar integrator in which the gate is set on the two transition regions. The balanced receiver 110, along with perhaps the polarizer 108 and other optics, is thus a means for detecting a change in the light caused by a reaction of the polarization altering means to a magnetic field of a subject that occurred when the polarization altering means was in one of the transition regions.

As shown in FIG. 2, film 114 typically requires a magnetic field of about 0.5 mT to switch between the two magnetization states, which is generated (FIG. 3) by the current flowing through the modulation coil 112. The test field transmitted to the test loop 118 is provided by a pulse generator 212 with a TTL output. The signal from the pulse generator 212 as well as that from the lock-in amplifier 206 is supplied to a signal oscilloscope 210. If the lock-in amplifier 206 has an output that supplies pulses, such as the EG&G model used, this output may be used instead of a separate pulse generator. Under normal operating conditions, of course, the test loop 118 and pulse generator 212 are absent, replaced by the object to be tested (which generates its own magnetic field).

The output voltage waveform from the pulse generator 212, shown in FIG. 5, is transmitted to the test loop 118 through a resistor of known value. The current through the test loop 118 can then be calculated or measured directly. Similarly, the magnetic field generated by the test loop 118 is calculated accordingly using the well-known formula for the on-axis magnetic field generated by a current loop:

$$B = \frac{\mu_0 i r^2}{2(r^2 + x^2)^{\frac{3}{2}}}, \tag{4}$$

where $\mu_0$ is the permeability of air, i is the current through the test loop 118, r is the radius of the test loop 118, and x is the axial distance from the test loop 118 to the point of measurement. This method of determining the test field has also been confirmed with a commercially-available magnetoresistive magnetic field detector. Note that the above formula is valid only for on-axis field calculations. While Eqn. 4 is accurate for calculating the test field strength present at the point on film 114 where the signal beam impinges, the field strength observed by the background beam must be calculated using a more complicated, but also well-known formula for the off-axis field. However, for the test loop 118, the magnetic field sensed by the background beam will be at least an order of magnitude smaller than that observed by the main beam and thus can be neglected without difficulty in the calculation.

The time-varying magnetic field ("modulation field") supplied by modulation coil 112 serves to upshift the test field frequency, thereby allowing signal processing to be conducted at frequencies much higher than those for magnetic fields produced by, for example, the human body and common power lines (60 Hz). Adding the low-frequency test signal to the high frequency carrier thus provides noise reduction by suppressing electronic 1/f and ambient noise. Neglecting non-linear amplification effects of the soft magnetic material 116, the magnetic field present at film 114 is a superposition of the modulation and test fields. These fields, in turn, are dependent upon the geometries of the modulation coil 112 and test loop 118 as well as the currents flowing through them. The superposition of the two fields can be expressed as:

$$B_0 = \mu_0 H = \mu_0(\alpha \cdot i_{mod} + \beta \cdot i_{test}) \tag{5}$$

where $\alpha$ and $\beta$ are geometric proportionality constants, and $i_{mod}$ and $i_{test}$ represent the currents producing the modulation and test magnetic fields, respectively. If the modulation coil current is periodic (not necessarily sinusoidal) with a frequency $\omega_0$ and the test current i(t) is an arbitrary function of time, then $B_0$ can be rewritten as:

$$B_0 = \mu_0 [\alpha \cdot i_0 \sin \omega_0 t + \beta \cdot i(t)] \tag{6}$$

where $i_0$ is the AC amplitude of the modulation current. The optical response of the film 114 can be related directly to the modulation and test currents by combining Equations (2) and (6):

$$\Delta\Theta_F = \mu_{rYIG}\mu_0[\alpha \cdot i_0 \sin \omega_0 t + \beta \cdot i(t)] \cdot V \cdot 2d \tag{7}$$

where 2d has replaced d to account for the two passes of both the main and background beams through film 114.

It might seem that the applied DC test field (i.e., i(t)=constant) would not affect the AC amplitude of the carrier frequency ($\omega_e$) and would simply introduce a DC shift in the detected optical signal. However, the varying slope in the hysteresis response of the film 114 actually allows the DC field to modulate the AC amplitude of the modulated signal. The graphs of FIG. 6 illustrate the change in the AC amplitude of the signal that is induced by a slight DC shift in the external field. The left-hand portion of FIG. 6 shows typical hysteresis curves (similar to that of FIG. 2) for two values of a DC shift. The waveforms on the right in FIG. 6 are those corresponding to the two values of DC shift.

In addition to improving the signal-to-noise (S/N) ratio of the signal from the balanced receiver, the preamplifier 202 includes a bandpass filter to attenuate line noise. As discussed earlier, the output of the preamplifier 202 is supplied to the lock-in amplifier 206, where the signal is further filtered to reject all components of the signal except that in the vicinity of the modulation frequency $\omega_0$). A comparison of representative unfiltered and filtered (200 Hz bandpass) signal waveforms are presented by the solid and dashed curves (respectively) of FIG. 7. The magnitude of the filtered waveform is proportional to the strength of the test field and after additional averaging by the digital oscilloscope (or a computer) to further increase the S/N ratio, the response of the detection system to the test field is obtained and FIG. 8 shows an example of the response (lower trace) to the test field waveform in the upper portion of the figure.

Although the monitoring and signal oscilloscopes may not be required during normal operation of the systems of FIGS. 3 and 4 (i.e. when actually used in MCG or other biomedical imaging application), they may be useful both for initial installation as well as performing diagnostics on the system when it is not performing adequately, for routine diagnostics, or when upgrading the arrangement. The output from the electronics may be transmitted to a computer which processes the information and provides it in a convenient and understandable display or printout.

Results from the system of FIGS. 3 and 4 have demonstrated the detection of magnetic fields below 100 pT. As examples, FIGS. 9 and 10 show the detection of magnetic fields of about 100 pT and about 8.4 pT, respectively. The voltage waveform (for the current supplied to the test loop) in these figures is included to show the match in the periodicity of the test signal (dotted) and the detected signal (solid). Detection of a field of 100 pT was accomplished repeatedly and the S/N ratio was better than 10:1; only one such test has been performed on fields below 10 pT. The test fields were chosen to roughly simulate the temporal behavior of the magnetic field produced by the human heart and thus had a duration of about 40 ms. Because of latency effects in the garnet film and the time constant associated with the lock-in amplifier 206, the detected waveform profile differs from that for the test current. This being said, recovering the original test waveform is readily accomplished with standard signal processing techniques such as deconvolution and the impulse response method.

The changes in experimental conditions during data collection—including ambient magnetic field noise caused by other equipment in the test environment and changes in the working point of the film—makes the detection of signals below 10 pT challenging. Although techniques are currently being explored to improve the S/N ratio for these ultra-weak signals, nonetheless, the data taken with a test field of 8.4 pT are clearly consistent with similar waveforms obtained at higher fields, as is observed in FIGS. 9 and 10. With these and perhaps the additional techniques described below, magnetic fields having strengths below about 1 pT should be ultimately detectable.

The embodiment of FIG. 3 is a system designed to measure weak magnetic fields at a single point in a plane. For some biomedical applications it is advantageous to record the magnetic field strength over a larger area of a plane so that an image of the magnetic field produced by, for example, the human heart can be reconstructed with well-known algorithms. It is straight forward to extend the system of FIG. 3 into an imaging arrangement suitable for biological applications or the like. FIG. 11 shows a second embodiment of the invention which is similar to that of FIG. 3. The electromagnetically shielded space 300 encloses the arrangement and may surround the test subject 318 as well. The arrangement includes an electromagnetic source 302 (as shown, a laser). An expander 304 enlarges the beam produced by the laser 302 so as to cover a larger area of the film 114. A half-wave ($\lambda/2$) plate 306 is disposed between the laser 302 and the polarizer 308. A mirror 307 directs the beam towards the polarizer 308 and subject 318. The presence of one or more mirrors allows the arrangement to be disposed within a compact area. The mirror 307 may also be combined with the $\lambda/2$ plate 306, in a manner similar to the splitter 106 of FIG. 3, thereby deceasing the number of components. The polarizer 308, which has an angled surface 309, the modulation coil 312, the YIG (or other magneto-optical) film 314, and the soft magnetic material 316 are all similar to those shown in FIG. 3.

the apparatus of FIG. 11, the balanced receiver 110 of FIG. 3 has been replaced by a low-noise CCD camera 310. A two or three dimensional CCD camera 310 permits the entire area of the subject 318 on which the beam impinges to be imaged simultaneously. Although the size of the beam may be less than or about the size of the active area of the CCD camera 310, the beam can be expanded by the expander 304 to an arbitrarily large size so long as the minimum power detectable by the CCD camera 310 is achieved. One advantage of expanding the beam and using a receiver such as the CCD camera is that accurate information about the entire area of interest of the subject can be obtained simultaneously using independent (e.g. isolated) channels. For the single point detection system of FIG. 3, the spatial resolution is generally determined by the diameter of the optical beam at the film surface. A two dimensional image is, therefore, attainable by having each pixel of the CCD camera 310 responsible for viewing a small portion of the film 314 surface. The CCD camera 310 may itself have imaging capabilities, or an imaging (field) lens may be inserted between the CCD camera 310 and the magneto-optical film 314. In fact, advances in CCD camera technology allow one to image the film 314 surface at high spatial resolution. For example, using a full 1024×1024 pixel system, areas of 5-10 cm$^2$ can readily be imaged with 50-100 μm spatial resolution with existing CCD cameras. Use of a gated, imaging CCD camera, having a high resolution enhances overall performance of the apparatus. In a gated CCD camera, one has the option of the camera "on" only during the two brief periods in each hysteresis cycle in which a transition occurs between the two magnetization states of the film. This may improve significantly the quality and S/N ratio of the images.

Signals from the CCD camera 310 are processed by processing software in a computer, a display, and memory or similar electronic equipment (not shown). Either image inversion software already developed by the MCG and MEG (SQUID), and MRI communities or specialized software may be used to recover from the measured field distribution at the magneto-optical film plane the magnetic field distribution of the object under examination. Advanced image processing techniques may be used for background noise subtraction and band-pass filtering similar to that accomplished by the lock-in amplifier 206. For MCG, for example, a reliable trigger (reference) signal for a lock-in amplifier, boxcar integrator, or CCD camera has been obtained using a trigger such as a simple LED-photodetector coupling module, which monitors blood absorption in either the fingertip or the earlobe to obtain a cardiac pulse waveform. This signal can be used as the trigger pulse for averaging signal waveforms to detect the MCG signal from the heart and thus may be a means for triggering the detection means.

Other techniques may be used to decrease the noise and increase the sensitivity of the apparatus, even above the high inherent sensitivity of this invention, to improve the overall performance of the magnetic field detector. As already noted, providing magnetic shielding for the space in which the apparatus and object to be examined are disposed is one such method. Such attention to detail can lower the noise level inside the room containing the apparatus by as much as one or two orders of magnitude. However, since the cost of fabricating a shielded room tends to be relatively expensive, it may be preferable for the compact arrangements of FIGS. 3, 11 and 12 to able to operate without such shielding. Alternatively, shielding simply the apparatus (which is relatively compact), rather than the entire room containing the apparatus and subject, reduces the cost of the system and increases its usefulness dramatically.

In addition, as the apparatus may be somewhat sensitive to vibrations, decreasing the sensitivity and exposure of the apparatus to external vibrations may also reduce the noise. By placing the apparatus (and preferably, but not necessarily, the subject) on a vibration-isolating platform, the noise caused by external vibrations can be reduced.

Selection of a source of garnet films different from the source used in providing the results shown in the figures may provide films with superior sensitivities. Furthermore, magneto-optical films other than garnets may also be suitable for detection. However, some caution is appropriate because, while an internal source of noise may arise from the film itself, a film whose optical response appears noisy may actually have a greater sensitivity to fluctuations in the ambient magnetic field. Finally, experiments conducted to date suggest that amorphous or single crystal (epitaxial) magneto-optical films may be superior to polycrystalline films because in polycrystalline films, the individual crystallites may have differing characteristics and thus contribute to system noise.

Other design considerations also influence the performance of the apparatus. These include grounding, layout of components, and the routing of wiring. All the optical components, including a compact 100-200 mW (or less) source laser, the polarizers, and the films themselves, can be mounted onto a single nonmagnetic frame and its enclosure shielded with μ-metal to decrease the noise of the apparatus. Also, a feedback mechanism to adjust the position of the thin film, laser power, detection timing (e.g. the point at which the signal is processed in the transition region) or other variables may be used to increase the S/N ratio.

Noise may be further reduced by the selection of an optimal modulation frequency. Results obtained thus far have primarily used an $\omega_0$ of about 620 Hz. However, for a number of reasons efforts have been made to increase the modulation frequency. As noted earlier, using a higher carrier frequency reduces the electronic 1/f noise. Moreover, a higher carrier frequency provides a higher sampling rate of the field from the object to be examined, as the film will have a greater number of sensitive transition periods (i.e., between the two magnetization states) during any given length of time. However, initial efforts to use higher values of $\omega_0$ have encountered the obstacle of demagnetization of the film. When the film is modulated below saturation between the magnetization states of the film at high frequencies, the film appears to gradually lose its sensitivity to weak magnetic fields, suggesting that the domains must be remagnetized at lower frequencies to regain their sensitivity. One solution to this problem may be alternating a high frequency (>1 kHz) modulation field used for sensing with an occasional low frequency field to remagnetize the film.

In addition, as above, the method for detecting weak magnetic fields utilizes the transition (or high slope) region in the hysteresis curve. While ideally the entire curve does not change with time, the actual form of the hysteresis curve is subject to many factors which may cause slight changes in the shape of the curve. The shape of the curve is important as it is generally desirable to operate in the section of the transition region where the slope is steepest, and thus, the optical response is greatest for the small change in magnetic field produced by the target magnetic field. If, however, after the optimal operating point is determined and set the hysteresis curve changes slightly, the response may vary dramatically.

The amplitude and frequency of the driving magnetic field, i.e. the modulation field produced by the modulation coil that sweeps the YIG film through the transition regions from one stable state to the other, are among the most important factors that alter the shape of the curve. It is thus beneficial to continuously optimize the driving field conditions in order to operate the detection system in the region of highest slope, thereby achieving the maximum sensitivity. The response generally varies most when first activating the system. However, once the system is operated and optimized, a slow drift in the operating parameters may occur due to other factors that influence the magnetic properties of the YIG film. One factor that may cause this slow drift is a variation in the temperature of the YIG film. The driving field can also be used to compensate for the change of the hysteresis curve due to these other factors.

An example of the optimization apparatus is shown in FIG. 13. The current driving the modulation coil 506 and the magnetization of the magneto-optical film 504 may be used to determine the hysteresis curve of the magneto-optical film 504 and optimize the operating point of the system. As in the previous embodiments, generally the laser beam 502 passes through a first polarizer 508, impinges on (and is altered by) the magneto-optical film 504, and is directed toward a second polarizer 510 and image sensing electronics (not shown). However, before the laser beam 502 reaches the second polarizer 510, a portion of the laser beam 502 is removed by a beam splitter 512. The portion of the laser beam 502 split off by the beam splitter 512 (the secondary laser beam) is directed through a third polarizer 514 and detected by a detection element 516. The signal from the detection element 516 is transmitted to optimization electronics 518 that may include an oscilloscope or other display. The detection element 516 can be as simple as a single photodiode.

The modulation magnetic field signal is established with using the current signal that drives the modulation coil 506. The magnetization of the magneto-optical film 504 is proportional to the power of the laser beam 502 after the cross polarization. The cross-polarized laser beam is the signal used to detect the weak magnetic field. In order not to interfere with the actual weak magnetic field measured while performing the optimization, the beam splitter 512 creates the secondary laser beam used for monitoring of the hysteresis curve (although this may not be necessary—the beam splitter may be placed after the second polarizer and the third polarizer eliminated). The electronics 518 detect a significant decrease in the magnetization signal and adjust the amplitude and/or frequency of the magnetic field accordingly by altering the current signal that drives the modulation coil 506. The detection element 516 produces an optimization signal that is dependent on the strength of the polarized secondary laser beam. The electronics 518 receives the optimization signal from the detection element 516, measures the slope of the section of the hysteresis curve in the transition region, and provides feedback to the driving magnetic field current supply so as to keep the system working under optimal conditions.

In one example, an oscilloscope is placed in an X-Y display mode and displays the optical response of the film as a function of the magnetic driving field, i.e. the oscilloscope displays the hysteresis curve. Thus, the current supplied to the modulation coils is displayed on the X axis and the optical response is displayed on the Y axis of the oscilloscope. Upon activation of the system, the optimal operation point can be adjusted by manually tuning the amplitude and frequency of the driving magnetic field.

Alternatively, a display does not need to be present. The electronics can include dedicated circuitry that automatically changes the frequency and amplitude of the driving magnetic field around the most recent optimal operating point so as to find the frequency and amplitude that provide the steepest transition region. Once optimization of the system is achieved (either manually or automatically), monitoring and perhaps adjustment of the system can be performed constantly or updated just before each time that the system takes data. For example, the system may sample the sensitivity at particular time intervals and optimize the system only if the hysteresis curve has changed, i.e. the sensitivity has decreased by a particular amount (e.g. percentage). This is to say that the operation point is periodically (or continually) monitored and optimized and thus is substantially maintained. Because changes in the hysteresis curve generally occur rather slowly, real time feedback may not be necessary. Rather, the system may again require optimization after a set period of time, such as several minutes. However, it may be beneficial to have continuous monitoring in case a catastrophic change occurs, requiring optimization sooner than the set period of time. In any case, a visual, audible or other signal may be provided to the operator to indicate that optimization is required or is in progress.

Noise interference due to external magnetic fields may also be reduced by implementing a gradiometer-type detection arrangement similar to that shown in FIG. 3. Such an arrangement relies on the fact that the human magnetic fields of primary interest are highly localized spatially whereas interfering ambient fields (such as those produced by indoor wiring, motors, etc.) generally have a smaller spatial gradient. As before, in the gradiometer configuration, the background is subtracted from the actual signal. Implementation of a gradiometer configuration and encasing only the optical apparatus and not the test subject in a well grounded, but compact, enclosure enables the apparatus to no longer require the optical system and subject to be shielded and yet achieve detection sensitivities below heart levels (30-100 pT).

FIG. 12 shows another arrangement implementing a gradiometer-type apparatus in the arrangement of FIG. 11. In this arrangement, two laser beams impinge on the receiver 410. Although the beams can be independently generated by different lasers, to minimize noise, a single laser 402 generates one beam, which is then split into two beams with a splitter 407 similar to that shown in FIG. 3. While both beams traverse a polarizer 408 that has an angled surface 409, one of the beams may be expanded by an expander 404 similar to that shown in FIG. 11. The expanded beam probes the thin film 414 within a desired area on the surface of film 414 to determine the magnetic field produced by the subject 418 within that area. The modulation coil 412 provides the alternating magnetic field to again switch the optical response of film 414 between the two magnetization states, and the soft magnetic film 416 (if required) increases the sensitivity of the thin film 414. A shield 400 of μ-metal or other shielding material encloses the apparatus.

The non-expanded beam provides a background signal that is used to decrease the noise level. This beam may, for example, impinge on a second YIG film 422 that is located far enough away from the magnetic field source to be measured such that the magnetic field does not substantially interfere with the signal generated. In the figure, the background beam is reflected by a mirror 420 such that the beam travels through the modulation coil 412. The second YIG film 422 also has a soft magnetic film 424, which can be a part of the soft magnetic film 416, for enhancement. Because of the rapid decay of magnetic field strength with distance from the source, usually several cm or less is required for such sufficient spatial isolation and thus the second magneto-optical film 422 need not be mounted far from the first magneto-optical film 414 to provide a reliable background signal. In this case, the second magneto-optical film 422 is preferably cut from the same wafer as the first magneto-optical film 414 so that the magneto-optical response of films 414 and 422 are substantially the same. Further, it is preferable that the location of the second film 422 be sufficiently close to the first film 414 to permit the same modulation coil 412 to sweep both films through their hysteresis curves. The second film 422 can be relatively small and have, for example, an ranging from tens of $(\mu m)^2$ to a few square mm, thereby decreasing the overall size of the magnetic detector.

Other configurations also may be used. For example, the mirror 420 may be disposed in a different location or multiple small pieces of film may be used. However, in general only a small piece of magneto-optical material that is sufficiently removed physically from the primary detection plane (and not necessarily lying in the detection plane) so as to only be sampling the ambient electromagnetic field may be used to supply the background signal. Alternatively, as shown in FIG. 3, the beam may impinge on a single film at a position sufficiently far from the magnetic field source to be measured, such that the magnetic field does not substantially interfere with the signal generated. Such an arrangement is an alternative to using two (or more) separate films.

In either case, a balanced, at least two channel photodetector (or perhaps a CCD camera) receives both the detected and background signals, and the background signal is subtracted from the signals arriving from the "live" pixels of the photodetector. The pixels of the camera may be linked to a simple bandpass filter and averaging circuit (such as a lock-in amplifier or boxcar integrator) centered on the coil modulation frequency, $\omega_0$. The bandpass filter and averaging circuit can be integrated onto a single chip or individual lock-in circuitry can be used as shown in FIG. 4. An external trigger based on the signal being detected may be used. For obtaining an MCG image, as above for example, an inexpensive, commercially-available heart rate monitor such as a simple LED/photodetector module, which clips onto the earlobe or fingertip and monitors blood absorption, may be used to economically and easily provide a cardiac pulse waveform as the trigger pulse for signal averaging.

In summary, the apparatus and method present herein uses the magneto-optical Faraday effect and exploits the transition region between two magnetization states of a magneto-optical film, to produce a low cost, highly sensitive magnetic detector that operates at room temperature. The magnetic field of a subject is determined by examining the polarization of light reflected from the magneto-optical film, because the polarization of the incident optical beam is rotated by an angle that is proportional to the strength of the magnetic field present. A several μm thick, bismuth-doped, garnet film serves as the detector as the transition regions between the two stable magnetization states of the film are sufficiently steep to provide large changes in the polarization rotation angle for small variations in the applied magnetic field.

The magneto-optical detection apparatus above may be entirely solid state/optical (using diode pumped solid state lasers, CCD cameras, and magneto-optical films), require only standard commercially available components, and is expected to be at least two orders of magnitude less expensive than existing imaging systems to purchase and maintain.

Such a magneto-optical detection apparatus using all solid state/optical components is much more compact than conventional detectors, requires only standard line voltage (i.e., could be operated off of a car battery and a DC-to-AC converter) and does not require cooling water. Thus, this detector is also less hazardous than conventional detectors, which may have high voltages or large amounts of current requirements as well as depending on and expensive coolant.

The magneto-optical detection apparatus provided may be used in the passive functional imaging of various organs and systems in humans and animals that produce sufficient magnetic fields, i.e. fields that exceed about 100 nG. For example, the apparatus may be used for cardiology and gastroenterology. Examples of the magnetic fields produced by various human organs and systems include the heart (peak magnetic field strength of ~1 µG), skeletal muscle (0.5 µG) and the abdominal cavity (1 µG). 3-D imaging may be able to be provided using this technique by either rotating the apparatus around the patent while constantly or intermittently detecting the magnetic field or rotating the patent.

The availability of a sensitive magneto-optical detection system provides another significant clinical application. Specifically, it is possible to track (temporally and spatially) magnetic particles introduced intentionally to the human body (or small animals) for diagnostic purposes. Magnetic particles are increasingly being applied to clinical diagnostics and treatment, including gastroenterology, drug and cell targeting, and in vivo diagnostics. Functionalized magnetic micro- and nano-particles (typically Fe-based) appear to be an emerging clinical tool and the optical system proposed here is well-suited as an inexpensive imaging system with considerably higher spatial resolution than that offered by the AC biosusceptometer and significantly less expensive than a SQUID gradiometer. Furthermore, the present invention is applicable to the measurement of iron tissue stores in humans and other animals.

It is intended that the foregoing detailed description be regarded as illustrative rather than limiting, and that it be understood that it is the following claims, including all equivalents, that are intended to define the spirit and scope of this invention. For example, printouts or displays of the results or signaling to an operator that the results are finished are fully within the spirit and scope of this invention.

The invention claimed is:

1. A detection apparatus to detect weak magnetic fields comprising:
    a first magneto-optical element that exhibits a response, in the form of Faraday rotation, to an applied magnetic field, a hysteresis characteristic of the Faraday rotation exhibiting transition regions between a plurality of stable states;
    a light source to emit light that impinges on the first magneto-optical element;
    a modulation element comprising a coil adjacent to the first magneto-optical element, the modulation element being a source of a time-varying magnetic field of sufficient strength to switch the first magneto-optical element between the stable states; and
    a detector configured to detect a change in the light caused by a reaction of the first magneto-optical element to a weak magnetic field of an organ or bodily system, the change occurring when the first magneto-optical element is in one of the transition regions,
    wherein the detection apparatus has a sensitivity sufficient to detect the weak magnetic field.

2. The detection apparatus of claim 1, further comprising a magnetic material having a high permeability and disposed sufficiently close to the first magneto-optical element to amplify an internal magnetic field in the first magneto-optical element formed by an external magnetic field impinging on and penetrating the first magneto-optical element.

3. The detection apparatus of claim 1, wherein the detector is configured in a gradiometer arrangement to subtract a background signal from an actual signal supplied from the first magneto-optical element affected by the weak magnetic field.

4. The detection apparatus of claim 1, further comprising a second magneto-optical element upon which the light impinges and that is affected substantially the same as the first magneto-optical element by the time-varying magnetic field, the second magneto-optical element configured to be substantially unaffected by the weak magnetic field and supplying the background signal.

5. The detection apparatus of claim 1, further comprising a trigger configured to detect an initialization signal from the weak magnetic field and transmit a trigger pulse to the detector.

6. The detection apparatus of claim 1, further comprising shielding to shield components of the detection apparatus from sources of electromagnetic radiation causing noise in the components.

7. The detection apparatus of claim 6, wherein the shielding is configured to additionally shield a source of the weak magnetic field.

8. The detection apparatus of claim 6, wherein a source of the weak magnetic field remains uncovered by the shielding.

9. The detection apparatus of claim 1, further comprising a vibration-isolating platform on which components of the detection apparatus are disposed.

10. The detection apparatus of claim 9, wherein the vibration-isolating platform is large enough to additionally hold a source of the weak magnetic field.

11. The detection apparatus of claim 1, wherein the first magneto-optical element comprises a doped YIG thin film has a thickness of less than about three microns.

12. The detection apparatus of claim 11, wherein the YIG film is formed from amorphous or single crystal material.

13. The detection apparatus of claim 1, further comprising a single nonmagnetic frame upon which optical components of the detection apparatus are mounted.

14. The detection apparatus of claim 1, wherein the modulation element is configured to apply a time-varying magnetic field of high frequency during detection and a low frequency field to remagnetize the first magneto-optical element.

15. The detection apparatus of claim 1, wherein the excitation source is a laser.

16. The detection apparatus of claim 1, further comprising an expander to enlarge an area of light from the light source impinging on the first magneto-optical element.

17. The detection apparatus of claim 1, wherein the organ or bodily system is of an animal.

18. The detection apparatus of claim 1, wherein the organ or bodily system is of a human.

19. The detection apparatus of claim 1, wherein the detector is characterized in that the change in the light detected is caused only when the first magneto-optical element was in one of the transition regions.

20. The detection apparatus of claim 1, further comprising an optimization apparatus to optimize the hysteresis characteristic such that an operating point is substantially maintained.

21. The detection apparatus of claim 20, wherein the operating point provides maximum magnetic field sensitivity.

22. The detection apparatus of claim 20, wherein the optimization apparatus adjusts at least one of an amplitude and a frequency of the time-varying magnetic field to substantially maintain the operating point.

23. The detection apparatus of claim 22, wherein the optimization apparatus comprises a detection element that detects the response of the first magneto-optical element and transmits an optimization signal to optimization electronics that measure a slope of the transition region near the operating point and provide feedback to the modulation element to adjust the time-varying magnetic field.

24. The detection apparatus of claim 23, wherein the optimization apparatus monitors the hysteresis characteristic of the first magneto-optical element and adjusts the time-varying magnetic field only if the hysteresis characteristic has changed by a predetermined amount.

25. A method of detecting weak magnetic fields comprising:
providing a first magneto-optical element exhibiting a response, in the form of Faraday rotation, to an applied magnetic field, a hysteresis characteristic of the Faraday rotation exhibiting transition regions between stable states, wherein the first magneto-optical element is in the presence of a weak magnetic field;
impinging light from a light source on the first magneto-optical element;
applying a time-varying magnetic field from a modulation element to the first magneto-optical element;
switching the first magneto-optical element between the stable states; and
detecting a change in the light caused by a reaction of the first magneto-optical element to the weak magnetic field of an organ or bodily system, the change occurring when the first magneto-optical element is in one of the transition regions.

26. The detection method of claim 25, wherein the time-varying magnetic field has a frequency substantially higher than 60 Hz.

27. The detection method of claim 25, further comprising amplifying an internal magnetic field of the first magneto-optical element using a magnetic material disposed adjacent to the first magneto-optical element and having a high permeability.

28. The detection method of claim 25, further comprising configuring components used in the detection method in a gradiometer arrangement to subtract a background signal from a subject signal supplied from the first magneto-optical element affected by the weak magnetic field.

29. The detection method of claim 25, further comprising providing a second magneto-optical element upon which the light impinges and that is affected substantially the same as the first magneto-optical element by the time-varying magnetic field, the second first magneto-optical element configured to be substantially unaffected by the weak magnetic field and supplying the background signal.

30. The detection method of claim 25, further comprising shielding components used in the detection method from sources of electromagnetic radiation causing noise in the components.

31. The detection method of claim 30, further comprising shielding a source of the weak magnetic field.

32. The detection method of claim 30, further comprising leaving a source of the weak magnetic field unshielded.

33. The detection method of claim 25, further comprising isolating components used in the detection method from vibrations.

34. The detection method of claim 33, further comprising isolating a source of the weak magnetic field from the vibrations.

35. The detection method of claim 25, wherein the first magneto-optical element comprises a doped YIG thin film that has a thickness of less than about three microns.

36. The detection method of claim 35, wherein the YIG film is formed from amorphous or single crystal material.

37. The detection method of claim 25, further comprising applying a time-varying magnetic field of a low frequency for remagnetizing the first magneto-optical element.

38. The detection method of claim 25, further comprising expanding an area of the light emitted from the light source.

39. The detection method of claim 25, wherein the organ or bodily system is of an animal.

40. The detection method of claim 25, wherein the organ or bodily system is of a human.

41. The detection method of claim 25, a heart provides the weak magnetic field.

42. The detection method of claim 41, further comprising detecting a cardiac pulse waveform and transmitting a trigger pulse to initiate detection.

43. The detection method of claim 25, further comprising tracking magnetic particles introduced intentionally to an animal.

44. The detection method of claim 25, wherein only the change in the light occurring when the first magneto-optical element is in one of the transition regions is detected.

45. The detection method of claim 25, further comprising optimizing the hysteresis characteristic such that an operating point is substantially maintained.

46. The detection method of claim 45, further comprising adjusting at least one of an amplitude and a frequency of the time-varying magnetic field to substantially maintain the operating point.

47. The detection method of claim 46, further comprising detecting a magnetization of the first magneto-optical element, measuring a slope of the transition region near the operating point and providing feedback to adjust the time-varying magnetic field.

48. The detection method of claim 47, further comprising monitoring the hysteresis characteristic and adjusting the time-varying magnetic field only if the hysteresis characteristic has changed by a predetermined amount.

49. The detection apparatus of claim 1, wherein the weak magnetic field is less than 100 pT.

50. The detection method of claim 25, wherein the weak magnetic field is less than 100 pT.

* * * * *

UNITED STATES PATENT AND TRADEMARK OFFICE
CERTIFICATE OF CORRECTION

| | | |
|---|---|---|
| PATENT NO. | : 8,000,767 B2 | Page 1 of 5 |
| APPLICATION NO. | : 10/762223 | |
| DATED | : August 16, 2011 | |
| INVENTOR(S) | : J. Gary Eden et al. | |

It is certified that error appears in the above-identified patent and that said Letters Patent is hereby corrected as shown below:

In the Claims

In column 19, after claim 1, insert the following claim:
--2. The detection apparatus of claim 1, wherein the modulation element is configured to apply a time-varying magnetic field of frequency substantially higher than 60 Hz.--.

In column 19, claim 2 should be renumbered as 3.

In column 20, claim 3 should be renumbered as 4.

In column 20, claim 4 should be renumbered as 5.

In column 20, claim 5 should be renumbered as 6.

In column 20, claim 6 should be renumbered as 7.

In column 20, claim 7 should be renumbered as 8 and in line 25, replace "claim 6" with --claim 7--.

In column 20, claim 8 should be renumbered as 9 and in line 28, replace "claim 6" with --claim 7--.

In column 20, claim 9 should be renumbered as 10.

In column 20, claim 10 should be renumbered as 11 and in line 33, replace "claim 9" with --claim 10--.

In column 20, claim 11 should be renumbered as 12.

Signed and Sealed this
Twenty-fourth Day of July, 2012

David J. Kappos
*Director of the United States Patent and Trademark Office*

In the Claims (cont'd)

In column 20, after claim 11, insert the following claim:
--13. The detection apparatus of claim 12, wherein the YIG film is doped with at least Bi.--.

In column 20, claim 12 should be renumbered as 14 and in line 39, replace "claim 11" with --claim 12--.

In column 20, claim 13 should be renumbered as 15.

In column 20, claim 14 should be renumbered as 16.

In column 20, claim 15 should be renumbered as 17.

In column 20, claim 16 should be renumbered as 18.

In column 20, claim 17 should be renumbered as 19.

In column 20, claim 18 should be renumbered as 20.

In column 20, after claim 18, insert the following claims:
--21. The detection apparatus of claim 20, wherein the organ is a heart.
  22. The detection apparatus of claim 21, further comprising a trigger configured to detect a cardiac pulse waveform and transmit a trigger pulse to the detector.
  23. The detection apparatus of claim 1, wherein the detection apparatus is configured to track magnetic particles introduced intentionally to an animal.--.

In column 20, claim 19 should be renumbered as 24.

In column 20, claim 20 should be renumbered as 25.

In column 20, claim 21 should be renumbered as 26 and in line 66, replace "claim 20" with --claim 25--.

In column 21, claim 22 should be renumbered as 27 and in line 1, replace "claim 20" with --claim 25--.

In column 21, claim 23 should be renumbered as 28 and in line 5, replace "claim 22" with --claim 27--.

In the Claims (cont'd)

In column 21, claim 24 should be renumbered as 29 and in line 12, replace "claim 23" with --claim 28--.

In column 21, claim 25 should be renumbered as 30.

In column 21, claim 26 should be renumbered as 31 and in line 35, replace "claim 25" with --claim 30--.

In column 21, claim 27 should be renumbered as 32 and in line 38, replace "claim 25" with --claim 30--.

In column 21, claim 28 should be renumbered as 33 and in line 43, replace "claim 25" with --claim 30--.

In column 21, claim 29 should be renumbered as 34 and in line 48, replace "claim 25" with --claim 30--.

In column 21, claim 30 should be renumbered as 35 and in line 55, replace "claim 25" with --claim 30--.

In column 22, claim 31 should be renumbered as 36 and in line 1, replace "claim 30" with --claim 35--.

In column 22, claim 32 should be renumbered as 37 and in line 3, replace "claim 30" with --claim 35--.

In column 22, claim 33 should be renumbered as 38 and in line 5, replace "claim 25" with --claim 30--.

In column 22, claim 34 should be renumbered as 39 and in line 8, replace "claim 33" with --claim 38--.

In column 22, claim 35 should be renumbered as 40 and in line 11, replace "claim 25" with --claim 30--.

In column 22, after claim 35, insert the following claim:
--41. The detection method of claim 40, wherein the YIG film is doped with at least Bi.--.

In column 22, claim 36 should be renumbered as 42 and in line 14, replace "claim 35" with --claim 40--.

In the Claims (cont'd)

In column 22, claim 37 should be renumbered as 43 and in line 16, replace "claim 25" with --claim 30--.

In column 22, claim 38 should be renumbered as 44 and in line 19, replace "claim 25" with --claim 30--.

In column 22, claim 39 should be renumbered as 45 and in line 21, replace "claim 25" with --claim 30--.

In column 22, claim 40 should be renumbered as 46 and in line 23, replace "claim 25" with --claim 30--.

In column 22, claim 41 should be renumbered as 47 and in line 25, replace "claim 25," with --claim 30, wherein--.

In column 22, claim 42 should be renumbered as 48 and in line 27, replace "claim 41" with --claim 47--.

In column 22, claim 43 should be renumbered as 49 and in line 30, replace "claim 25" with --claim 30--.

In column 22, claim 44 should be renumbered as 50 and in line 33, replace "claim 25" with --claim 30--.

In column 22, claim 45 should be renumbered as 51 and in line 36, replace "claim 25" with --claim 30--.

In column 22, after claim 45, insert the following claim:
--52. The detection method of claim 30, further comprising optimizing the hysteresis characteristic such that a maximum magnetic field sensitivity is substantially maintained.--.

In column 22, claim 46 should be renumbered as 53 and in line 39, replace "claim 45" with --claim 51--.

In column 22, claim 47 should be renumbered as 54 and in line 43, replace "claim 46" with --claim 53--.

In column 22, claim 48 should be renumbered as 55 and in line 48, replace "claim 47" with --claim 54--.

CERTIFICATE OF CORRECTION (continued)
U.S. Pat. No. 8,000,767 B2

In the Claims (cont'd)

In column 22, claim 49 should be renumbered as 56.

In column 22, claim 50 should be renumbered as 57 and in line 54, replace "claim 25" with --claim 30--.